(12) United States Patent
Tran et al.

(10) Patent No.: US 10,896,368 B2
(45) Date of Patent: Jan. 19, 2021

(54) ANALOG NEURAL MEMORY SYSTEM FOR DEEP LEARNING NEURAL NETWORK COMPRISING MULTIPLE VECTOR-BY-MATRIX MULTIPLICATION ARRAYS AND SHARED COMPONENTS

(71) Applicant: Silicon Storage Technology, Inc., San Jose, CA (US)

(72) Inventors: Hieu Van Tran, San Jose, CA (US); Thuan Vu, San Jose, CA (US); Stanley Hong, San Jose, CA (US); Anh Ly, San Jose, CA (US)

(73) Assignee: SILICON STORAGE TECHNOLOGY, INC., San Jose, CA (US)

( * ) Notice: Subject to any disclaimer, the term of this patent is extended or adjusted under 35 U.S.C. 154(b) by 0 days.

(21) Appl. No.: 16/746,837

(22) Filed: Jan. 18, 2020

(65) Prior Publication Data
US 2020/0272886 A1 Aug. 27, 2020

Related U.S. Application Data

(62) Division of application No. 16/182,492, filed on Nov. 6, 2018.
(Continued)

(51) Int. Cl.
*G06F 17/16* (2006.01)
*G06N 3/04* (2006.01)
(Continued)

(52) U.S. Cl.
CPC ........... *G06N 3/0445* (2013.01); *G06F 17/16* (2013.01); *G06N 3/0635* (2013.01);
(Continued)

(58) Field of Classification Search
CPC ............................. G06F 17/16; G06N 3/0445
(Continued)

(56) References Cited

U.S. PATENT DOCUMENTS 5,029,130 A 7/1991 Yeh
6,747,310 B2 6/2004 Fan
(Continued)

FOREIGN PATENT DOCUMENTS

TW 201818233 A 5/2018
TW 201824096 A 7/2018

OTHER PUBLICATIONS

Xinjie Guo, et al, "Mixed Signal Neurocomputing Based on Floating-gate Memories," retrieved from the Internet, URL:httns://www.alexandria.ucsb.edu/lib/ark:/48907/f3ih3mn0. up. 1-106, Jan. 2017.*
(Continued)

*Primary Examiner* — Muna A Techane
(74) *Attorney, Agent, or Firm* — DLA Piper LLP US

(57) ABSTRACT

Numerous embodiments are disclosed for an analog neuromorphic memory system for use in a deep learning neural network. In one embodiment, the analog neuromorphic memory system comprises a plurality of vector-by-matrix multiplication systems, each vector-by-matrix multiplication system comprising an array of memory cells, a low voltage row decoder, a high voltage row decoder, and a low voltage column decoder; a plurality of output blocks, each output block providing an output in response to at least one of the plurality of vector-by-matrix multiplication systems; and a shared verify block configured to concurrently perform a verify operation after a program operation on two or more of the plurality of vector-by-matrix systems.

14 Claims, 38 Drawing Sheets

Related U.S. Application Data

(60) Provisional application No. 62/720,902, filed on Aug. 21, 2018.

(51) Int. Cl.
| | |
|---|---|
| *G06N 3/063* | (2006.01) |
| *G11C 16/04* | (2006.01) |
| *G11C 16/10* | (2006.01) |
| *G11C 16/34* | (2006.01) |
| *G11C 16/14* | (2006.01) |
| *G11C 16/30* | (2006.01) |
| *G11C 16/08* | (2006.01) |
| *G06N 3/08* | (2006.01) |

(52) U.S. Cl.
CPC .......... *G11C 16/0425* (2013.01); *G11C 16/08* (2013.01); *G11C 16/10* (2013.01); *G11C 16/14* (2013.01); *G11C 16/30* (2013.01); *G11C 16/3459* (2013.01); *G06N 3/08* (2013.01)

(58) Field of Classification Search
USPC ..................................................... 365/185.29
See application file for complete search history.

(56) References Cited

U.S. PATENT DOCUMENTS

| | | |
|---|---|---|
| 2009/0080256 A1 | 3/2009 | Lee |
| 2016/0027504 A1* | 1/2016 | Lee .................. G11C 16/3459 |
| | | 365/185.03 |
| 2017/0091616 A1 | 3/2017 | Gokmen |
| 2017/0337466 A1 | 11/2017 | Bayat et al. |
| 2018/0144243 A1 | 5/2018 | Hsieh et al. |
| 2018/0173438 A1* | 6/2018 | Li ........................ G06F 3/0655 |
| 2019/0164617 A1 | 5/2019 | Tran et al. |

OTHER PUBLICATIONS

Can Li, et al., "Long short-term memory networks in memristor crossbars," ARXIV. ORG. Cornell University Library, May 30, 2018, XP081234765, pp. 1-27.*

Xinjie Guo et al ("Mixed Signal Neurocomputing Based on Floating-gate Memories") (Year: Mar. 2017).*

Xinjie Guo, et al, "Mixed Signal Neurocomputing Based on Floating-gate Memories," retrieved from the Internet, URL:https://www.alexandria.ucsb.edu/lib/ark:/48907/f3jh3mn0, pp. 1-106, Jan. 2017.

Matthew R. Kucic, et al., "Analog Computing Arrays," retrieved from the Internet, URL:http://hdl.handle.net/1853/4878, pp. 1-131.

* cited by examiner

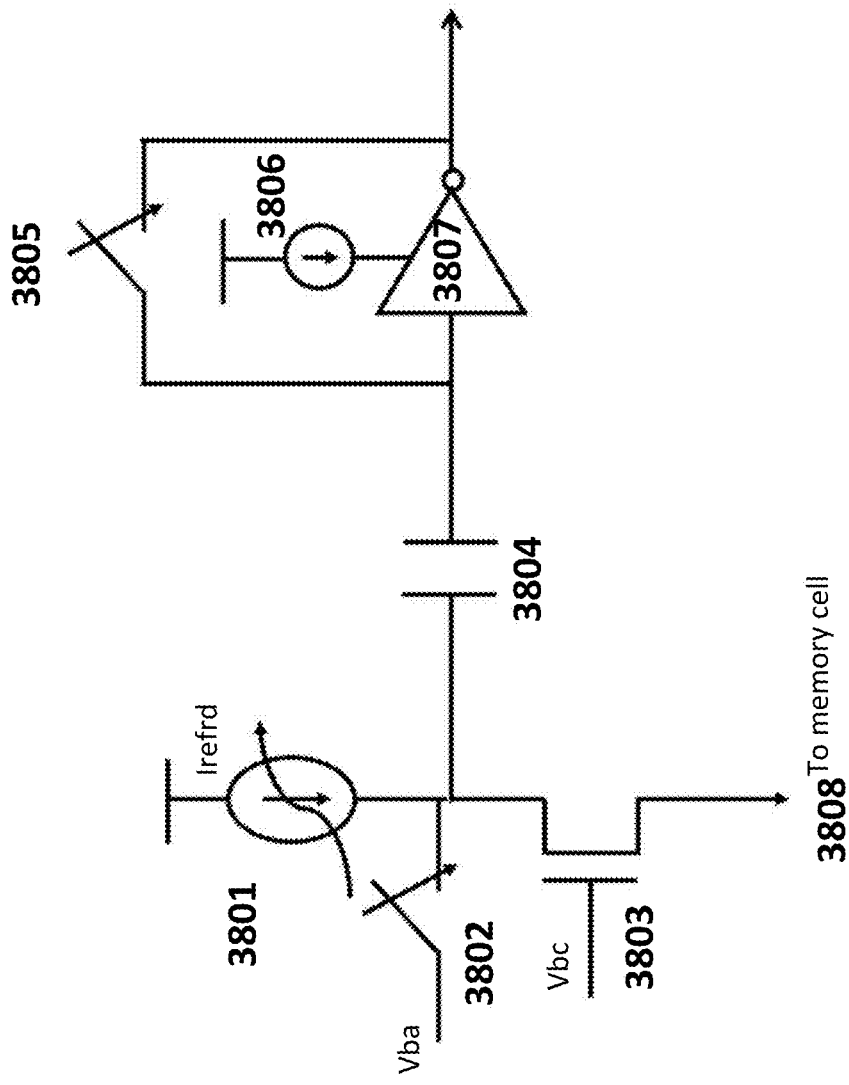

ANALOG NEURAL MEMORY SYSTEM FOR DEEP LEARNING NEURAL NETWORK COMPRISING MULTIPLE VECTOR-BY-MATRIX MULTIPLICATION ARRAYS AND SHARED COMPONENTS

PRIORITY CLAIM

This application is a divisional application of U.S. patent application Ser. No. 16/182,492, filed on Nov. 6, 2018, and titled, "Analog Neural Memory System for Deep Learning Neural Network Comprising Multiple Vector-By-Matrix Multiplication Arrays and Shared Components," which claims priority to U.S. Provisional Patent Application No. 62/720,902, filed on Aug. 21, 2018, and titled, "Analog Neural Memory System for Deep Learning Neural Network Comprising Multiple Vector-By-Matrix Multiplication Arrays and Shared Components," both of which are incorporated by reference herein.

FIELD OF THE INVENTION

Numerous embodiments are disclosed for an analog neuromorphic memory system for use in a deep learning neural network. The analog neuromorphic memory system comprises a plurality of vector-by-matrix multiplication arrays and various components shared by those arrays, including high voltage generation blocks, verify blocks, and testing blocks.

BACKGROUND OF THE INVENTION

Artificial neural networks mimic biological neural networks (the central nervous systems of animals, in particular the brain) and are used to estimate or approximate functions that can depend on a large number of inputs and are generally unknown. Artificial neural networks generally include layers of interconnected "neurons" which exchange messages between each other.

FIG. 1 illustrates an artificial neural network, where the circles represent the inputs or layers of neurons. The connections (called synapses) are represented by arrows, and have numeric weights that can be tuned based on experience. This makes neural networks adaptive to inputs and capable of learning. Typically, neural networks include a layer of multiple inputs. There are typically one or more intermediate layers of neurons, and an output layer of neurons that provide the output of the neural network. The neurons at each level individually or collectively make a decision based on the received data from the synapses.

One of the major challenges in the development of artificial neural networks for high-performance information processing is a lack of adequate hardware technology. Indeed, practical neural networks rely on a very large number of synapses, enabling high connectivity between neurons, i.e. a very high computational parallelism. In principle, such complexity can be achieved with digital supercomputers or specialized graphics processing unit clusters. However, in addition to high cost, these approaches also suffer from mediocre energy efficiency as compared to biological networks, which consume much less energy primarily because they perform low-precision analog computation. CMOS analog circuits have been used for artificial neural networks, but most CMOS-implemented synapses have been too bulky given the high number of neurons and synapses.

Applicant previously disclosed an artificial (analog) neural network that utilizes one or more non-volatile memory arrays as the synapses in U.S. patent application Ser. No. 15/594,439, which is incorporated by reference. The non-volatile memory arrays operate as an analog neuromorphic memory. The neural network device includes a first plurality of synapses configured to receive a first plurality of inputs and to generate therefrom a first plurality of outputs, and a first plurality of neurons configured to receive the first plurality of outputs. The first plurality of synapses includes a plurality of memory cells, wherein each of the memory cells includes spaced apart source and drain regions formed in a semiconductor substrate with a channel region extending there between, a floating gate disposed over and insulated from a first portion of the channel region and a non-floating gate disposed over and insulated from a second portion of the channel region. Each of the plurality of memory cells is configured to store a weight value corresponding to a number of electrons on the floating gate. The plurality of memory cells is configured to multiply the first plurality of inputs by the stored weight values to generate the first plurality of outputs.

Each non-volatile memory cells used in the analog neuromorphic memory system must be erased and programmed to hold a very specific and precise amount of charge, i.e., the number of electrons, in the floating gate. For example, each floating gate must hold one of N different values, where N is the number of different weights that can be indicated by each cell. Examples of N include 16, 32, 64, 128, and 256.

One unique characteristic of analog neuromorphic memory systems is that the system must support two different types of read operations. In a normal read operation, an individual memory cell is read as in conventional memory systems. However, in a neural read operation, the entire array of memory cells is read at one time, where each bit line will output a current that is the sum of all currents from the memory cells connected to that bit line.

Supporting both types of read operations leads to several challenges. For example, the system must be able to provide a wide range of voltage and current levels for the various operations that are applied to individual cells, entire arrays, or even all of the arrays at once. This requires extensive circuitry outside of the arrays themselves, which can increase the amount of space needed on a semiconductor die for the system, as well as increase power consumption and manufacturing cost.

What is needed is an improved architecture for an analog neuromorphic memory system that utilizes vector-by-matrix multiplication arrays of flash memory cells that minimizes the amount of circuitry required outside of the arrays themselves.

SUMMARY OF THE INVENTION

Numerous embodiments are disclosed for an analog neuromorphic memory system for use in a deep learning neural network. In one embodiment, the analog neuromorphic memory system comprises a plurality of vector-by-matrix multiplication systems, each vector-by-matrix multiplication system comprising an array of memory cells, a low voltage row decoder, a high voltage row decoder, and a low voltage column decoder; a plurality of output blocks, each output block providing an output in response to at least one of the plurality of vector-by-matrix multiplication systems; and a shared verify block configured to concurrently perform a verify operation after a program operation on two or more of the plurality of vector-by-matrix systems.

BRIEF DESCRIPTION OF THE DRAWINGS

FIG. 38 depicts a sense amplifier circuit for use in the flash analog neuromorphic memory shared architecture system of FIG. 22.

DETAILED DESCRIPTION OF THE INVENTION

The artificial neural networks of the present invention utilize a combination of CMOS technology and non-volatile memory arrays.

Non-Volatile Memory Cells

Figure 1:
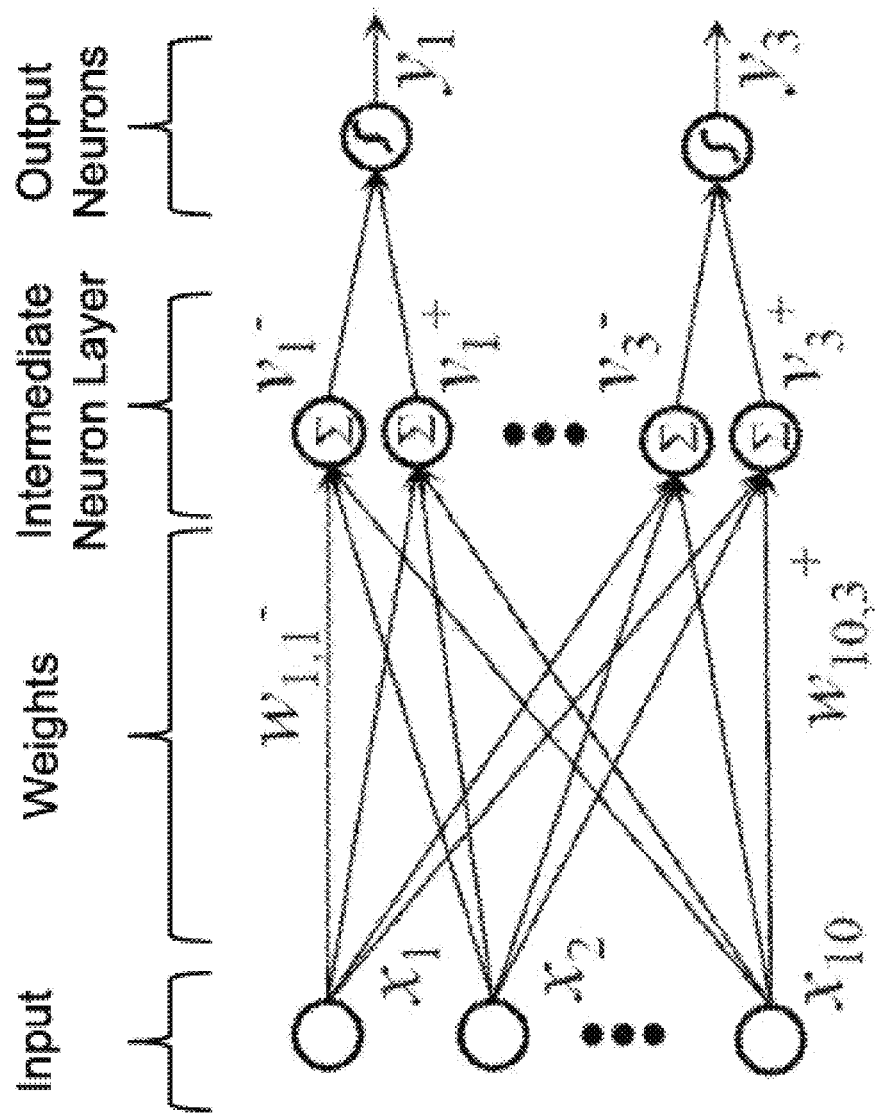
FIG. 1 is a diagram that illustrates a prior art artificial neural network.
Figure 2:
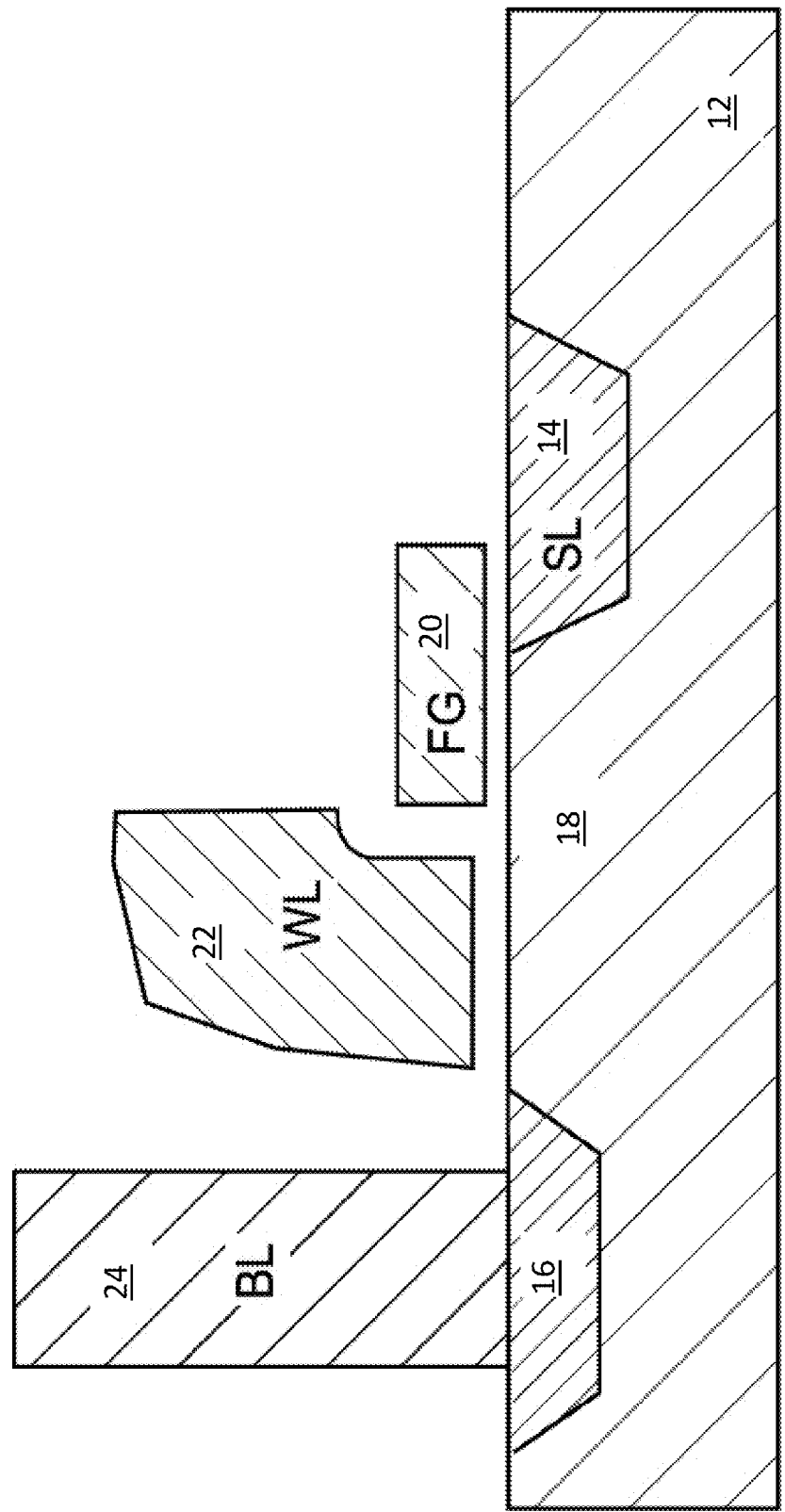
FIG. 2 is a cross-sectional side view of a conventional 2-gate non-volatile memory cell.

Digital non-volatile memories are well known. For example, U.S. Pat. No. 5,029,130 ("the '130 patent"), which is incorporated herein by reference, discloses an array of split gate non-volatile memory cells, which are a type of flash memory cells, and is incorporated herein by reference for all purposes. Such a memory cell 210 is shown in FIG. 2. Each memory cell 210 includes source region 14 and drain region 16 formed in a semiconductor substrate 12, with a channel region 18 there between. A floating gate 20 is formed over and insulated from (and controls the conductivity of) a first portion of the channel region 18, and over a portion of the source region 14. A word line terminal 22 (which is typically coupled to a word line) has a first portion that is disposed over and insulated from (and controls the conductivity of) a second portion of the channel region 18, and a second portion that extends up and over the floating gate 20. The floating gate 20 and word line terminal 22 are insulated from the substrate 12 by a gate oxide. Bitline 24 is coupled to drain region 16.

Memory cell 210 is erased (where electrons are removed from the floating gate) by placing a high positive voltage on the word line terminal 22, which causes electrons on the floating gate 20 to tunnel through the intermediate insulation from the floating gate 20 to the word line terminal 22 via Fowler-Nordheim tunneling.

Memory cell 210 is programmed (where electrons are placed on the floating gate) by placing a positive voltage on the word line terminal 22, and a positive voltage on the source region 14. Electron current will flow from the source region 14 towards the drain region 16. The electrons will accelerate and become heated when they reach the gap between the word line terminal 22 and the floating gate 20.

Some of the heated electrons will be injected through the gate oxide onto the floating gate 20 due to the attractive electrostatic force from the floating gate 20.

Memory cell 210 is read by placing positive read voltages on the drain region 16 and word line terminal 22 (which turns on the portion of the channel region 18 under the word line terminal). If the floating gate 20 is positively charged (i.e. erased of electrons), then the portion of the channel region 18 under the floating gate 20 is turned on as well, and current will flow across the channel region 18, which is sensed as the erased or "1" state. If the floating gate 20 is negatively charged (i.e. programmed with electrons), then the portion of the channel region under the floating gate 20 is mostly or entirely turned off, and current will not flow (or there will be little flow) across the channel region 18, which is sensed as the programmed or "0" state.

Table No. 1 depicts typical voltage ranges that can be applied to the terminals of memory cell 110 for performing read, erase, and program operations:

TABLE NO. 1

Figure 3:
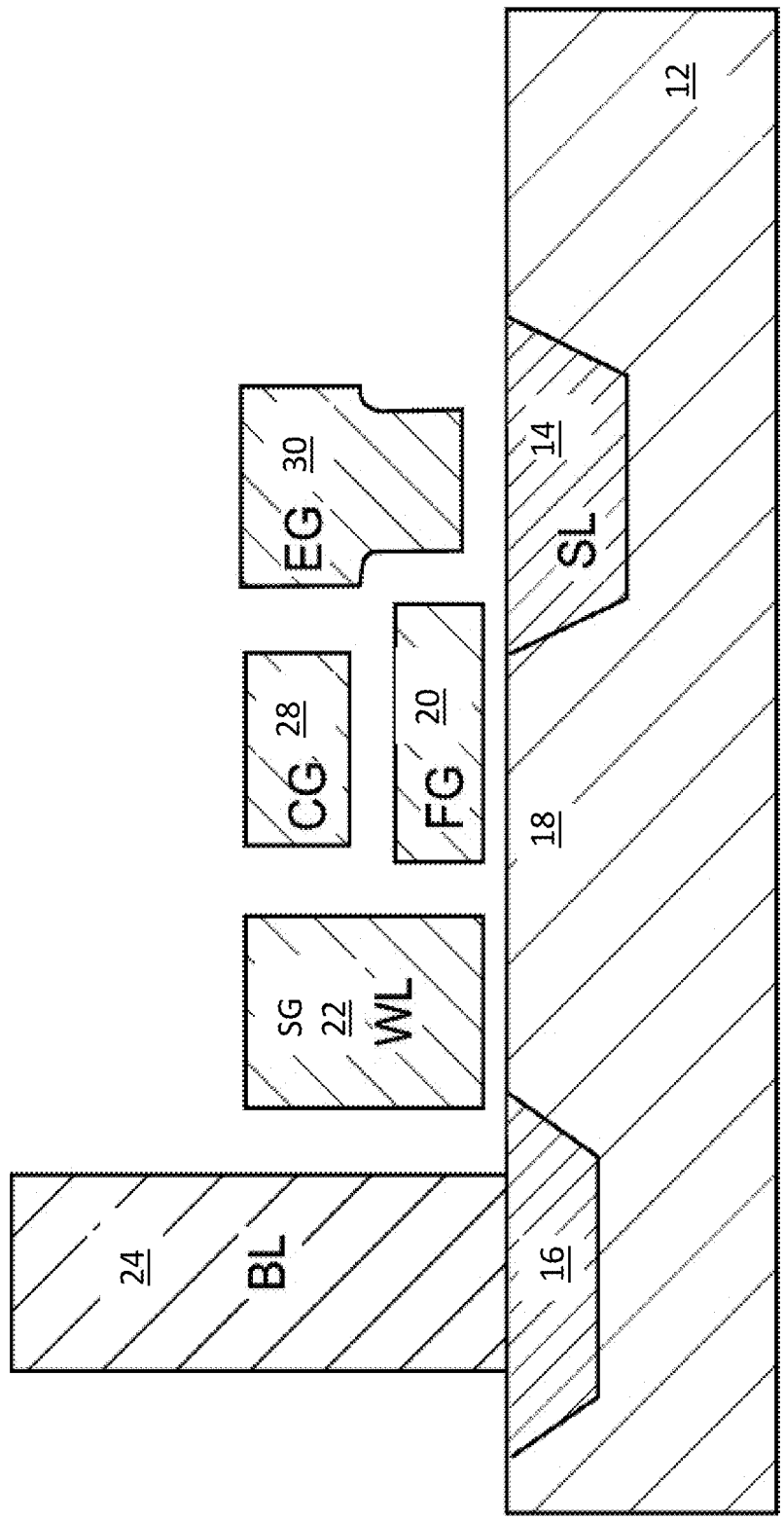
FIG. 3 is a cross-sectional side view of a conventional 4-gate non-volatile memory cell.

| Operation of Flash Memory Cell 210 of FIG. 3 | | | |
|---|---|---|---|
| | WL | BL | SL |
| Read | 2-3 V | 0.6-2 V | 0 V |
| Erase | ~11-13 V | 0 V | 0 V |
| Program | 1-2 V | 1-3 µA | 9-10 V |

Other split gate memory cell configurations, which are other types of flash memory cells, are known. For example, FIG. 3 depicts a four-gate memory cell 310 comprising source region 14, drain region 16, floating gate 20 over a first portion of channel region 18, a select gate 22 (typically coupled to a word line, WL) over a second portion of the channel region 18, a control gate 28 over the floating gate 20, and an erase gate 30 over the source region 14. This configuration is described in U.S. Pat. No. 6,747,310, which is incorporated herein by reference for all purposes). Here, all gates are non-floating gates except floating gate 20, meaning that they are electrically connected or connectable to a voltage source. Programming is performed by heated electrons from the channel region 18 injecting themselves onto the floating gate 20. Erasing is performed by electrons tunneling from the floating gate 20 to the erase gate 30.

Table No. 2 depicts typical voltage ranges that can be applied to the terminals of memory cell 310 for performing read, erase, and program operations:

TABLE NO. 2

| Operation of Flash Memory Cell 310 of FIG. 3 | | | | | |
|---|---|---|---|---|---|
| | WL/SG | BL | CG | EG | SL |
| Read | 1.0-2 V | 0.6-2 V | 0-2.6 V | 0-2.6 V | 0 V |
| Erase | -0.5 V/0 V | 0 V | 0 V/-8 V | 8-12 V | 0 V |
| Program | 1 V | 1 µA | 8-11 V | 4.5-9 V | 4.5-5 V |

Figure 4:
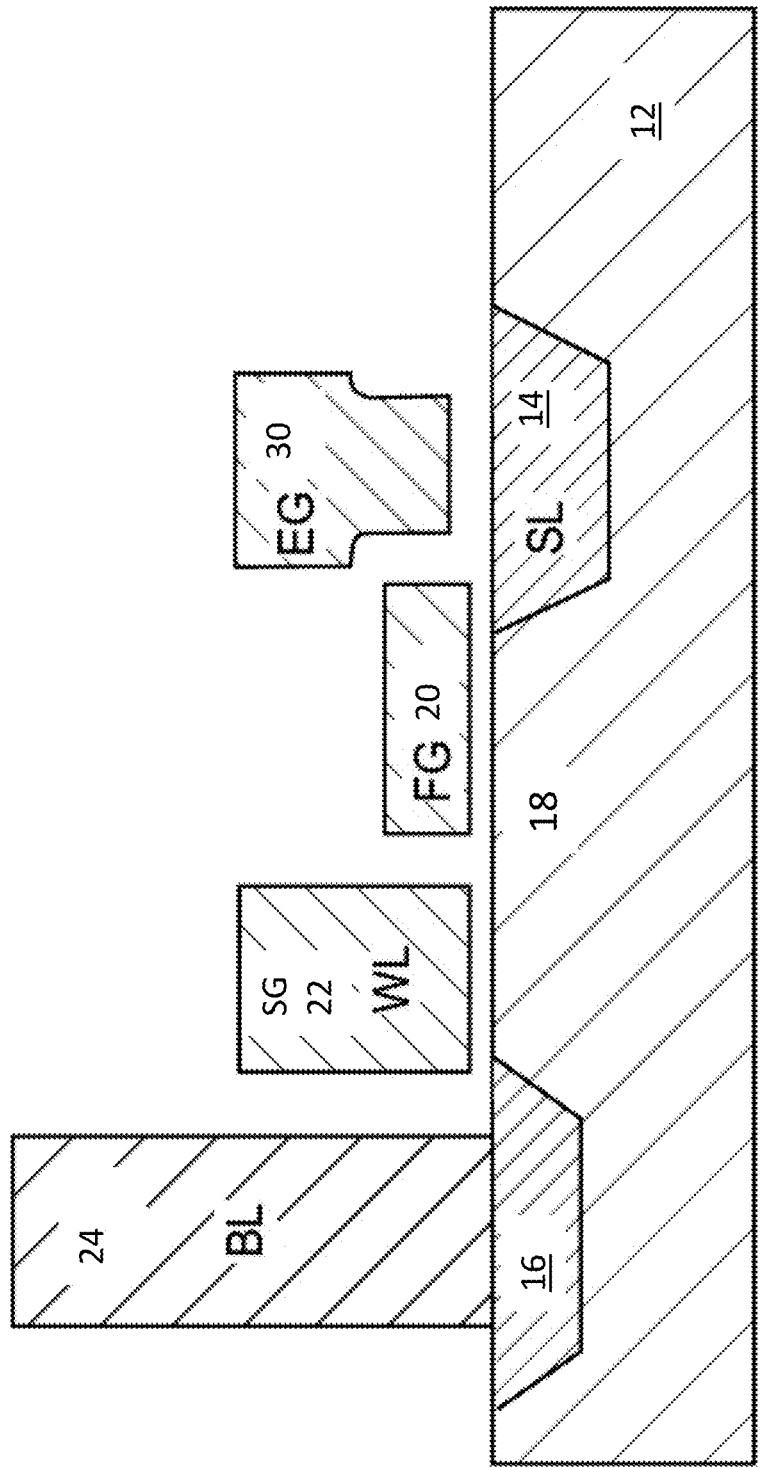
FIG. 4 is a side cross-sectional side view of conventional 3-gate non-volatile memory cell.

FIG. 4 depicts a three-gate memory cell 410, which is another type of flash memory cell. Memory cell 410 is identical to the memory cell 310 of FIG. 3 except that memory cell 410 does not have a separate control gate. The erase operation (whereby erasing occurs through use of the erase gate) and read operation are similar to that of the FIG. 3 except there is no control gate bias applied. The programming operation also is done without the control gate bias, and as a result, a higher voltage must be applied on the source line during a program operation to compensate for a lack of control gate bias.

Table No. 3 depicts typical voltage ranges that can be applied to the terminals of memory cell 410 for performing read, erase, and program operations:

TABLE NO. 3

| Operation of Flash Memory Cell 410 of FIG. 4 | | | | |
|---|---|---|---|---|
| | WL/SG | BL | EG | SL |
| Read | 0.7-2.2 V | 0.6-2 V | 0-2.6 V | 0 V |
| Erase | -0.5 V/0 V | 0 V | 11.5 V | 0 V |
| Program | 1 V | 2-3 µA | 4.5 V | 7-9 V |

Figure 5:
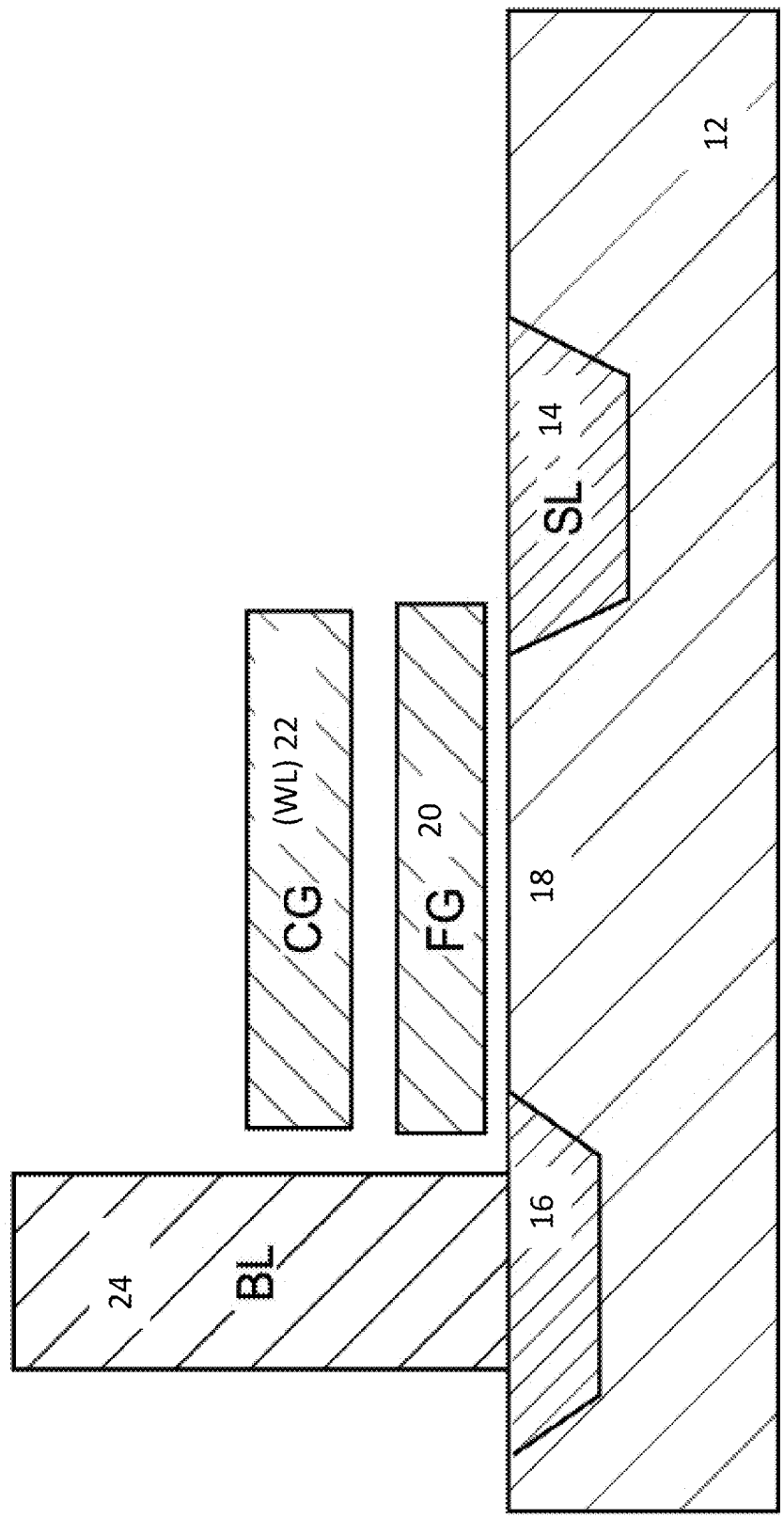
FIG. 5 is a cross-sectional side view of another conventional 2-gate non-volatile memory cell.

FIG. 5 depicts stacked gate memory cell 510, which is another type of flash memory cell. Memory cell 510 is similar to memory cell 210 of FIG. 2, except that floating gate 20 extends over the entire channel region 18, and control gate 22 (which here will be coupled to a word line) extends over floating gate 20, separated by an insulating layer (not shown). The erase, programming, and read operations operate in a similar manner to that described previously for memory cell 210.

Table No. 4 depicts typical voltage ranges that can be applied to the terminals of memory cell 510 and substrate 12 for performing read, erase, and program operations:

TABLE NO. 4

| Operation of Flash Memory Cell 510 of FIG. 5 | | | | |
|---|---|---|---|---|
| | CG | BL | SL | Substrate |
| Read | 2-5 V | 0.6-2 V | 0 V | 0 V |
| Erase | -8 to -10 V/0 V | FLT | FLT | 8-10 V/15-20 V |
| Program | 8-12 V | 3-5 V | 0 V | 0 V |

In order to utilize the memory arrays comprising one of the types of non-volatile memory cells described above in an artificial neural network, two modifications are made. First, the lines are configured so that each memory cell can be individually programmed, erased, and read without adversely affecting the memory state of other memory cells in the array, as further explained below. Second, continuous (analog) programming of the memory cells is provided.

Specifically, the memory state (i.e. charge on the floating gate) of each memory cell in the array can be continuously changed from a fully erased state to a fully programmed state, independently and with minimal disturbance of other memory cells. In another embodiment, the memory state (i.e., charge on the floating gate) of each memory cell in the array can be continuously changed from a fully programmed state to a fully erased state, and vice-versa, independently and with minimal disturbance of other memory cells. This means the cell storage is analog or at the very least can store one of many discrete values (such as 16 or 64 different values), which allows for very precise and individual tuning of all the cells in the memory array, and which makes the memory array ideal for storing and making fine tuning adjustments to the synapsis weights of the neural network.

Neural Networks Employing Non-Volatile Memory Cell Arrays

Figure 6:
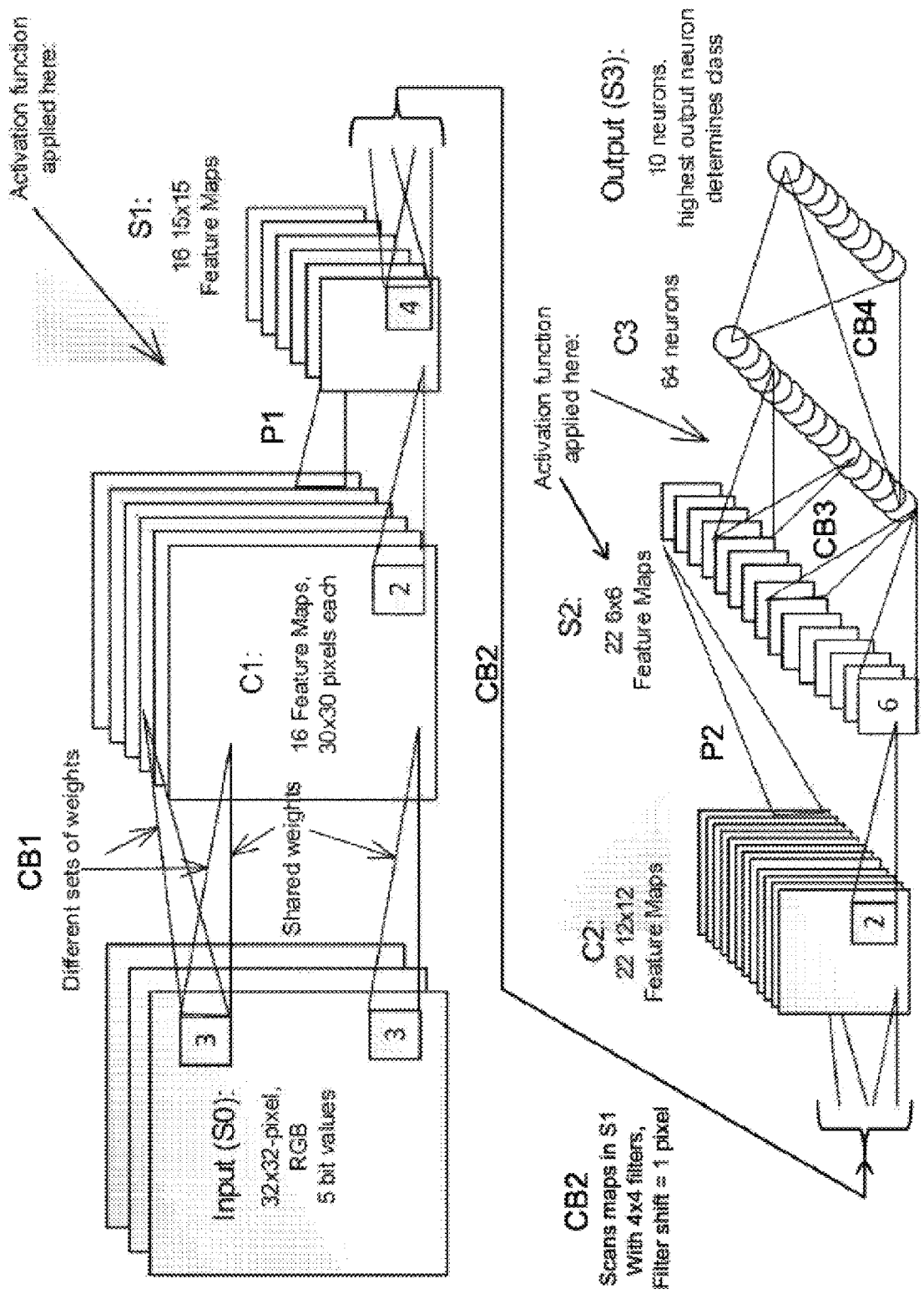
FIG. 6 is a diagram illustrating the different levels of an exemplary artificial neural network utilizing a non-volatile memory array.

FIG. 6 conceptually illustrates a non-limiting example of a neural network utilizing a non-volatile memory array of the present embodiments. This example uses the non-volatile memory array neural network for a facial recognition application, but any other appropriate application could be implemented using a non-volatile memory array based neural network.

S0 is the input layer, which for this example is a 32×32 pixel RGB image with 5 bit precision (i.e. three 32×32 pixel arrays, one for each color R, G and B, each pixel being 5 bit precision). The synapses CB1 going from input layer S0 to layer C1 apply different sets of weights in some instances and shared weights in other instances, and scan the input image with 3×3 pixel overlapping filters (kernel), shifting the filter by 1 pixel (or more than 1 pixel as dictated by the model). Specifically, values for 9 pixels in a 3×3 portion of the image (i.e., referred to as a filter or kernel) are provided to the synapses CB1, where these 9 input values are multiplied by the appropriate weights and, after summing the outputs of that multiplication, a single output value is determined and provided by a first synapse of CB1 for generating a pixel of one of the layers of feature map C1. The 3×3 filter is then shifted one pixel to the right within input layer S0 (i.e., adding the column of three pixels on the right, and dropping the column of three pixels on the left), whereby the 9 pixel values in this newly positioned filter are provided to the synapses CB1, where they are multiplied by the same weights and a second single output value is determined by the associated synapse. This process is continued until the 3×3 filter scans across the entire 32×32 pixel image of input layer S0, for all three colors and for all bits (precision values). The process is then repeated using different sets of weights to generate a different feature map of C1, until all the features maps of layer C1 have been calculated.

In layer C1, in the present example, there are 16 feature maps, with 30×30 pixels each. Each pixel is a new feature pixel extracted from multiplying the inputs and kernel, and therefore each feature map is a two dimensional array, and thus in this example layer C1 constitutes 16 layers of two dimensional arrays (keeping in mind that the layers and arrays referenced herein are logical relationships, not necessarily physical relationships—i.e., the arrays are not necessarily oriented in physical two dimensional arrays). Each of the 16 feature maps in layer C1 is generated by one of sixteen different sets of synapse weights applied to the filter scans. The C1 feature maps could all be directed to different aspects of the same image feature, such as boundary identification. For example, the first map (generated using a first weight set, shared for all scans used to generate this first map) could identify circular edges, the second map (generated using a second weight set different from the first weight set) could identify rectangular edges, or the aspect ratio of certain features, and so on.

An activation function P1 (pooling) is applied before going from layer C1 to layer S1, which pools values from consecutive, non-overlapping 2×2 regions in each feature map. The purpose of the pooling function is to average out the nearby location (or a max function can also be used), to reduce the dependence of the edge location for example and to reduce the data size before going to the next stage. At layer S1, there are 16 15×15 feature maps (i.e., sixteen different arrays of 15×15 pixels each). The synapses CB2 going from layer S1 to layer C2 scan maps in S1 with 4×4 filters, with a filter shift of 1 pixel. At layer C2, there are 22 12×12 feature maps. An activation function P2 (pooling) is applied before going from layer C2 to layer S2, which pools values from consecutive non-overlapping 2×2 regions in each feature map. At layer S2, there are 22 6×6 feature maps. An activation function (pooling) is applied at the synapses CB3 going from layer S2 to layer C3, where every neuron in layer C3 connects to every map in layer S2 via a respective synapse of CB3. At layer C3, there are 64 neurons. The synapses CB4 going from layer C3 to the output layer S3 fully connects C3 to S3, i.e. every neuron in layer C3 is connected to every neuron in layer S3. The output at S3 includes 10 neurons, where the highest output neuron determines the class. This output could, for example, be indicative of an identification or classification of the contents of the original image.

Each layer of synapses is implemented using an array, or a portion of an array, of non-volatile memory cells.

Figure 7:
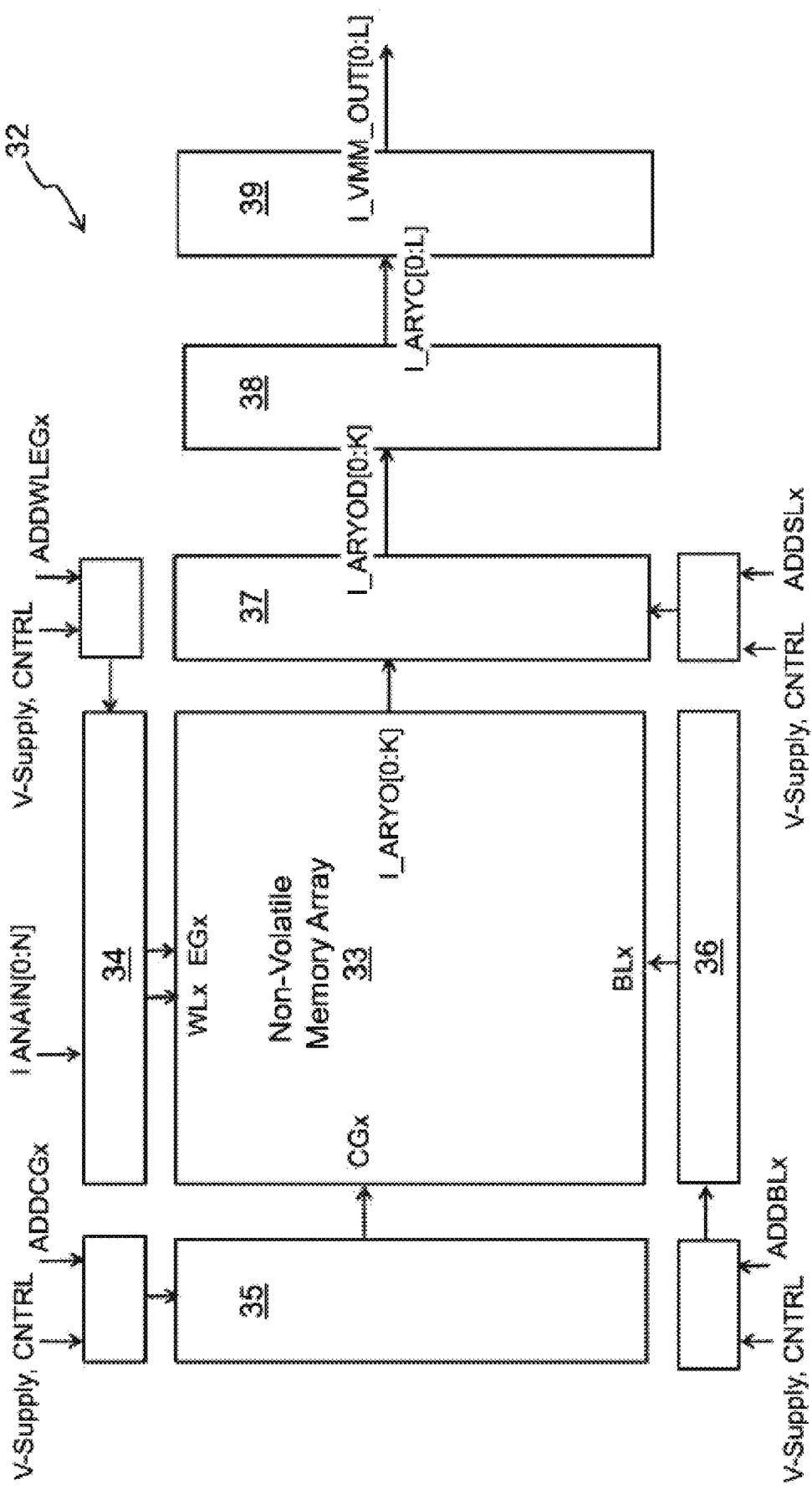
FIG. 7 is a block diagram illustrating a vector multiplier matrix.

FIG. 7 is a block diagram of an array that can be used for that purpose. Vector-by-matrix multiplication (VMM) array 32 includes non-volatile memory cells and is utilized as the synapses (such as CB1, CB2, CB3, and CB4 in FIG. 6) between one layer and the next layer. Specifically, VMM array 32 includes an array of non-volatile memory cells 33, erase gate and word line gate decoder 34, control gate decoder 35, bit line decoder 36 and source line decoder 37, which decode the respective inputs for the non-volatile memory cell array 33. Input to VMM array 32 can be from the erase gate and wordline gate decoder 34 or from the control gate decoder 35. Source line decoder 37 in this example also decodes the output of the non-volatile memory cell array 33. Alternatively, bit line decoder 36 can decode the output of the non-volatile memory cell array 33.

Non-volatile memory cell array 33 serves two purposes. First, it stores the weights that will be used by the VMM array 32. Second, the non-volatile memory cell array 33 effectively multiplies the inputs by the weights stored in the non-volatile memory cell array 33 and adds them up per output line (source line or bit line) to produce the output, which will be the input to the next layer or input to the final layer. By performing the multiplication and addition function, the non-volatile memory cell array 33 negates the need for separate multiplication and addition logic circuits and is also power efficient due to its in-situ memory computation.

The output of non-volatile memory cell array 33 is supplied to a differential summer (such as a summing op-amp or a summing current mirror) 38, which sums up the outputs of the non-volatile memory cell array 33 to create a single value for that convolution. The differential summer 38 is arranged to perform summation of positive weight and negative weight.

The summed up output values of differential summer 38 are then supplied to an activation function circuit 39, which rectifies the output. The activation function circuit 39 may provide sigmoid, tanh, or ReLU functions. The rectified output values of activation function circuit 39 become an element of a feature map as the next layer (e.g. C1 in FIG. 6), and are then applied to the next synapse to produce the next feature map layer or final layer. Therefore, in this example, non-volatile memory cell array 33 constitutes a plurality of synapses (which receive their inputs from the prior layer of neurons or from an input layer such as an image database), and summing op-amp 38 and activation function circuit 39 constitute a plurality of neurons.

The input to VMM array 32 in FIG. 7 (WLx, EGx, CGx, and optionally BLx and SLx) can be analog level, binary level, or digital bits (in which case a DAC is provided to convert digital bits to appropriate input analog level) and the output can be analog level, binary level, or digital bits (in which case an output ADC is provided to convert output analog level into digital bits).

Figure 8:
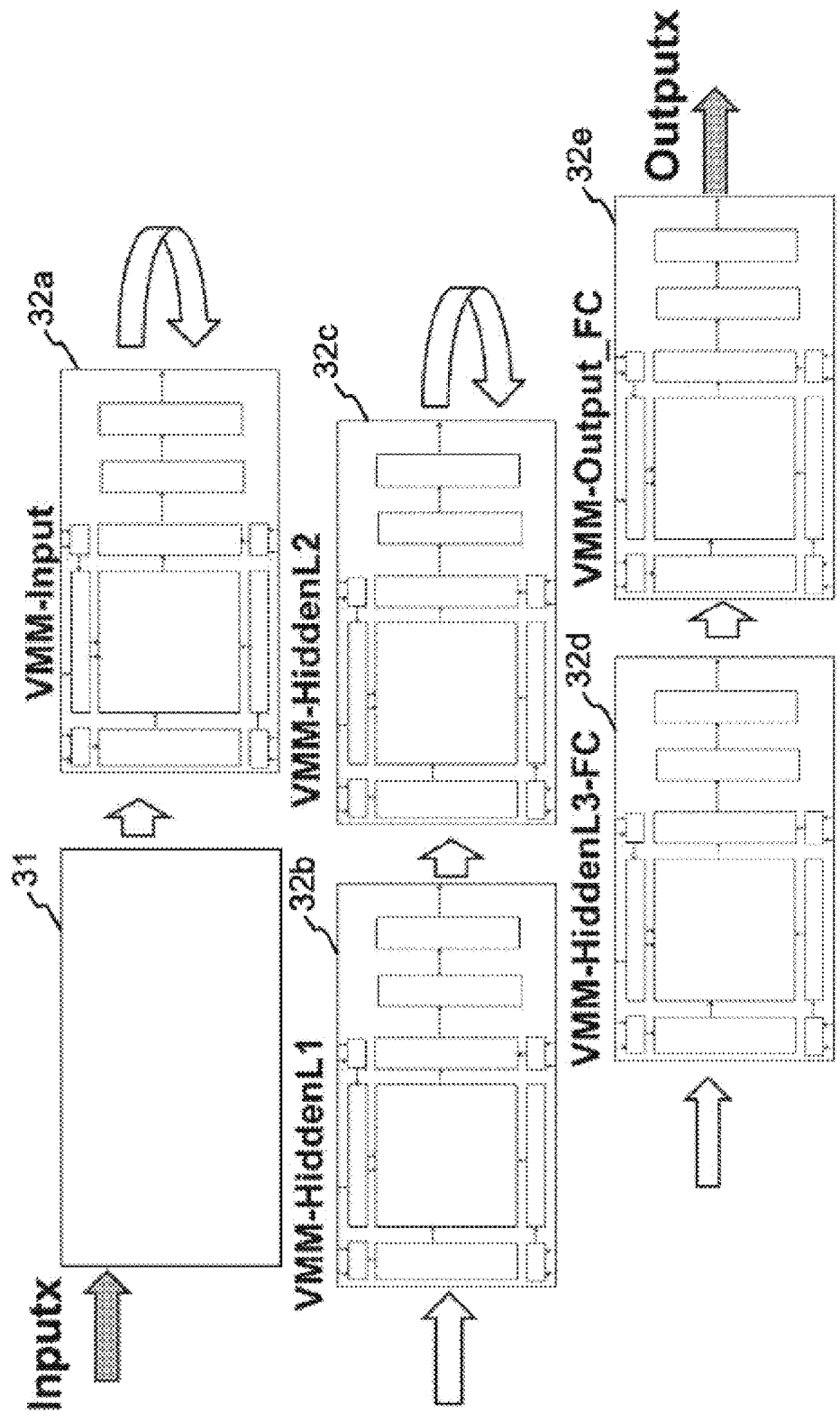
FIG. 8 is a block diagram illustrating various levels of a vector multiplier matrix.

FIG. 8 is a block diagram depicting the usage of numerous layers of VMM arrays 32, here labeled as VMM arrays 32a, 32b, 32c, 32d, and 32e. As shown in FIG. 8, the input, denoted Inputx, is converted from digital to analog by a digital-to-analog converter 31, and provided to input VMM array 32a. The converted analog inputs could be voltage or current. The input D/A conversion for the first layer could be done by using a function or a LUT (look up table) that maps the inputs Inputx to appropriate analog levels for the matrix multiplier of input VMM array 32a. The input conversion could also be done by an analog to analog (A/A) converter to convert an external analog input to a mapped analog input to the input VMM array 32a.

The output generated by input VMM array 32a is provided as an input to the next VMM array (hidden level 1) 32b, which in turn generates an output that is provided as an input to the next VMM array (hidden level 2) 32c, and so on. The various layers of VMM array 32 function as different layers of synapses and neurons of a convolutional neural network (CNN). Each VMM array 32a, 32b, 32c, 32d, and 32e can be a stand-alone, physical non-volatile memory array, or multiple VMM arrays could utilize different portions of the same physical non-volatile memory array, or multiple VMM arrays could utilize overlapping portions of the same physical non-volatile memory array. The example shown in FIG. 8 contains five layers (32a, 32b, 32c, 32d, 32e): one input layer (32a), two hidden layers (32b, 32c), and two fully connected layers (32d, 32e). One of ordinary skill in the art will appreciate that this is merely exemplary and that a system instead could comprise more than two hidden layers and more than two fully connected layers.

Vector-by-Matrix Multiplication (VMM) Arrays

Figure 9:
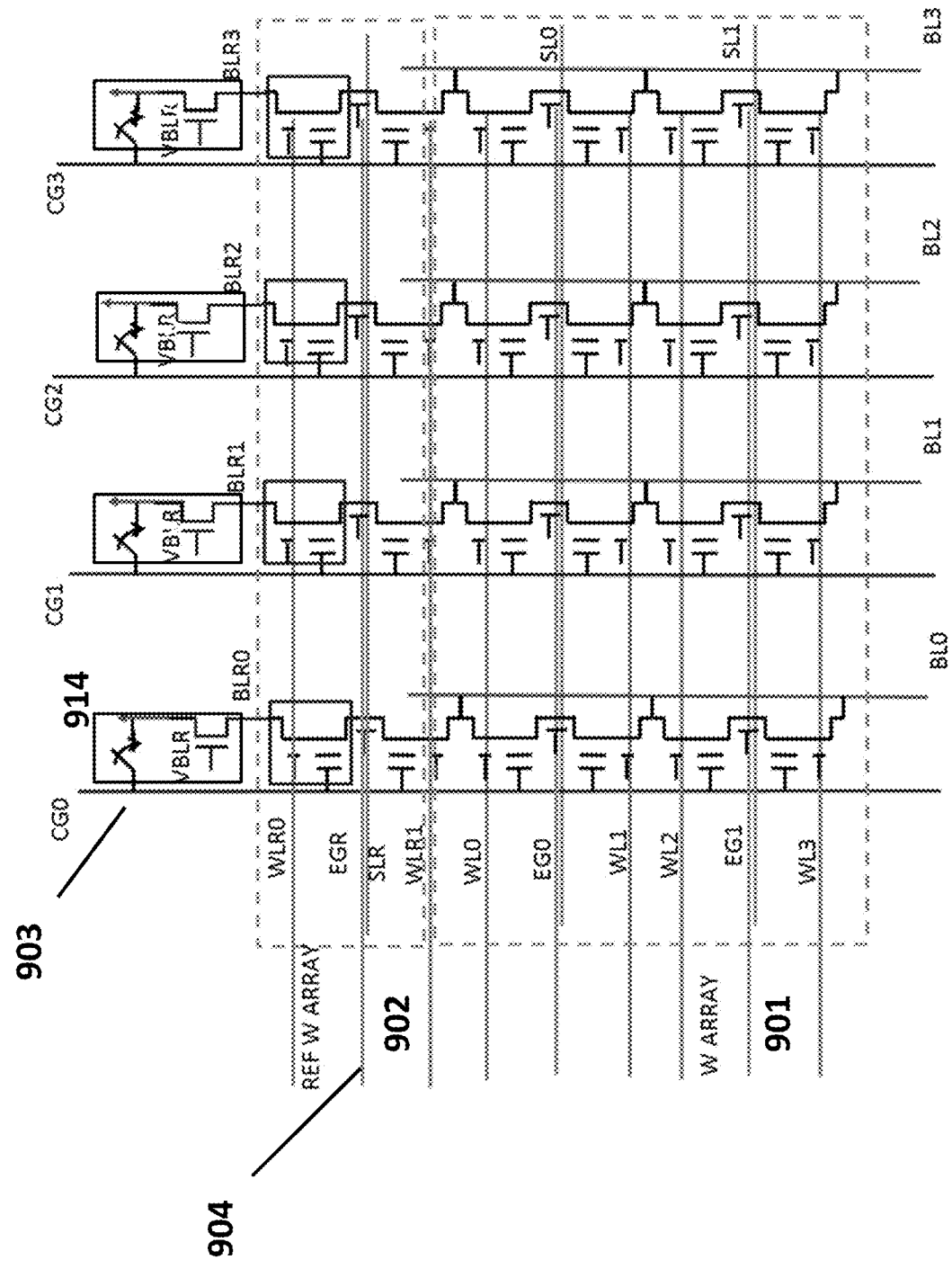
FIG. 9 depicts another embodiment of a vector multiplier matrix.

FIG. 9 depicts neuron VMM array 900, which is particularly suited for memory cells 310 as shown in FIG. 3, and is utilized as the synapses and parts of neurons between an input layer and the next layer. VMM array 900 comprises memory array 901 of non-volatile memory cells and reference array 902 (at the top of the array) of non-volatile reference memory cells. Alternatively, another reference array can be placed at the bottom.

In VMM array 900, control gate lines, such as control gate line 903, run in a vertical direction (hence reference array 902 in the row direction is orthogonal to control gate line 903), and erase gate lines, such as erase gate line 904, run in a horizontal direction. Here, the inputs to VMM array 900 are provided on the control gate lines (CG0, CG1, CG2, CG3), and the output of VMM array 900 emerges on the source lines (SL0, SL1). In one embodiment, only even rows are used, and in another embodiment, only odd rows are used. The current placed on each source line (SL0, SL1, respectively) performs a summing function of all the currents from the memory cells connected to that particular source line.

As described herein for neural networks, the non-volatile memory cells of VMM array 900, i.e. the flash memory of VMM array 900, are preferably configured to operate in a sub-threshold region.

The non-volatile reference memory cells and the non-volatile memory cells described herein are biased in weak inversion:

$$Ids=Io*e^{(Vg-Vth)/kVt}=w*Io*e^{(Vg)/kVt},$$

where $w=e^{(-Vth)/kVt}$

For an I-to-V log converter using a memory cell (such as a reference memory cell or a peripheral memory cell) or a transistor to convert input current into an input voltage:

$$Vg=k*Vt*\log[Ids/wp*Io]$$

Here, wp is w of a reference or peripheral memory cell.

For a memory array used as a vector matrix multiplier VMM array, the output current is:

$$Iout=wa*Io*e^{(Vg)/kVt}, \text{namely}$$

$$Iout=(wa/wp)*Iin=W*Iin$$

$$W=e^{(Vthp-Vtha)/kVt}$$

Here, wa=w of each memory cell in the memory array.

A wordline or control gate can be used as the input for the memory cell for the input voltage.

Alternatively, the flash memory cells of VMM arrays described herein can be configured to operate in the linear region:

$$Ids=beta*(Vgs-Vth)*Vds; beta=u*Cox*W/L$$

$$W=\alpha(Vgs-Vth)$$

A wordline or control gate or bitline or sourceline can be used as the input for the memory cell operated in the linear region for the input voltage.

For an I-to-V linear converter, a memory cell (such as a reference memory cell or a peripheral memory cell) or a transistor operating in the linear region can be used to linearly convert an input/output current into an input/output voltage.

Other embodiments for VMM array 32 of FIG. 7 are described in U.S. patent application Ser. No. 15/826,345, which is incorporated by reference herein. As described in that application. a sourceline or a bitline can be used as the neuron output (current summation output).

Figure 10:
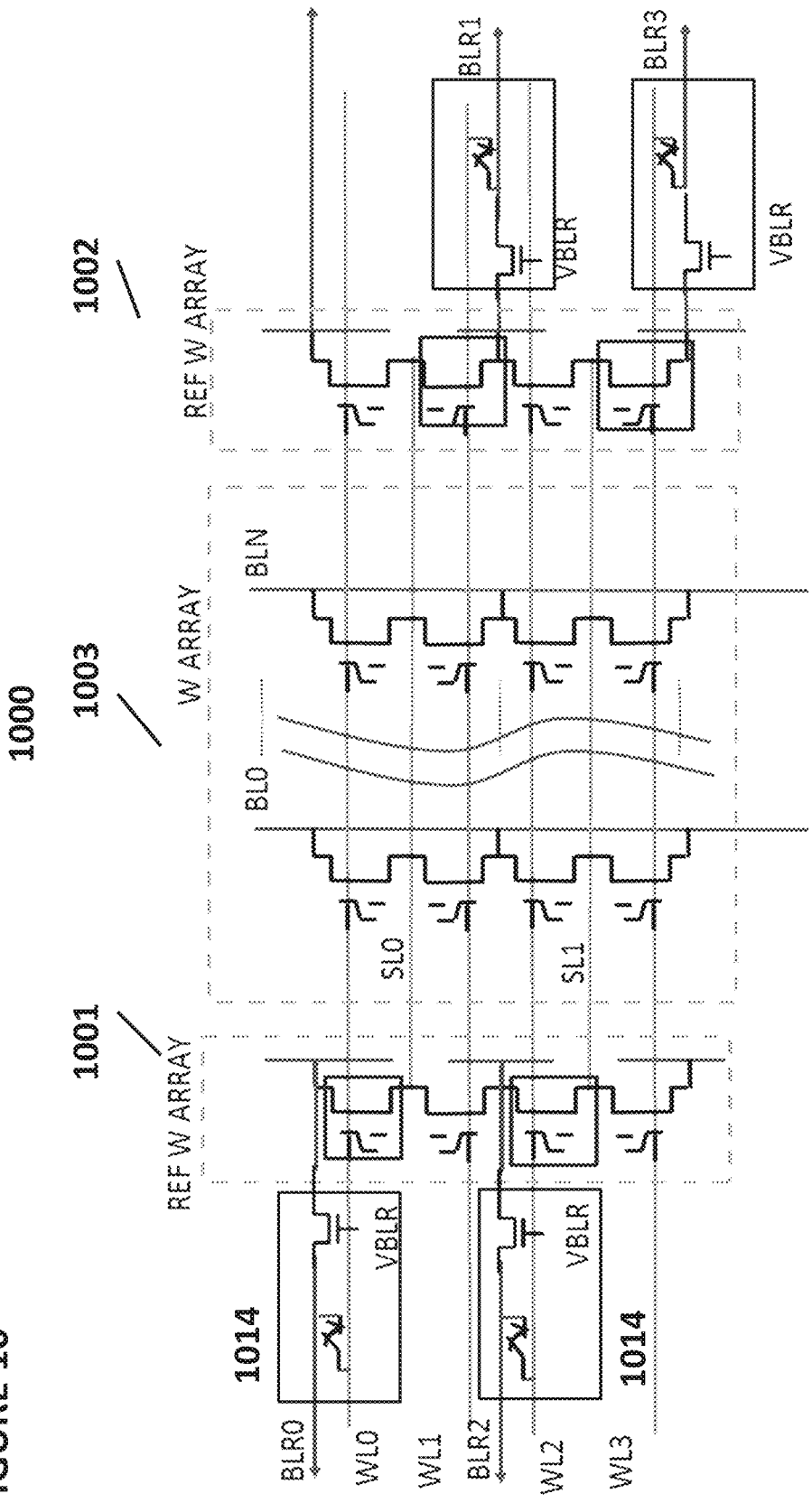
FIG. 10 depicts another embodiment of a vector multiplier matrix.

FIG. 10 depicts neuron VMM array 1000, which is particularly suited for memory cells 210 as shown in FIG. 2, and is utilized as the synapses between an input layer and the next layer. VMM array 1000 comprises a memory array 1003 of non-volatile memory cells, reference array 1001 of first non-volatile reference memory cells, and reference array 1002 of second non-volatile reference memory cells. Reference arrays 1001 and 1002, arranged in the column direction of the array, serve to convert current inputs flowing into terminals BLR0, BLR1, BLR2, and BLR3 into voltage inputs WL0, WL1, WL2, and WL3. In effect, the first and second non-volatile reference memory cells are diode-connected through multiplexors 1014 with current inputs flowing into them. The reference cells are tuned (e.g., programmed) to target reference levels. The target reference levels are provided by a reference mini-array matrix (not shown).

Memory array 1003 serves two purposes. First, it stores the weights that will be used by the VMM array 1000 on respective memory cells thereof. Second, memory array 1003 effectively multiplies the inputs (i.e. current inputs provided in terminals BLR0, BLR1, BLR2, and BLR3, which reference arrays 1001 and 1002 convert into the input voltages to supply to wordlines WL0, WL1, WL2, and WL3) by the weights stored in the memory array 1003 and then adds all the results (memory cell currents) to produce the output on the respective bit lines (BL0-BLN), which will be the input to the next layer or input to the final layer. By performing the multiplication and addition function, memory array 1003 negates the need for separate multiplication and addition logic circuits and is also power efficient. Here, the voltage inputs are provided on the word lines WL0, WL1, WL2, and WL3, and the output emerges on the respective bit lines BL0-BLN during a read (inference) operation. The current placed on each of the bit lines BL0-BLN performs a summing function of the currents from all non-volatile memory cells connected to that particular bitline.

Table No. 5 depicts operating voltages for VMM array 1000. The columns in the table indicate the voltages placed on word lines for selected cells, word lines for unselected cells, bit lines for selected cells, bit lines for unselected cells, source lines for selected cells, and source lines for unselected cells. The rows indicate the operations of read, erase, and program.

TABLE NO. 5

Operation of VMM Array 1000 of FIG. 10:

|  | WL | WL -unsel | BL | BL -unsel | SL | SL -unsel |
|---|---|---|---|---|---|---|
| Read | 1-3.5 V | −0.5 V/0 V | 0.6-2 V (Ineuron) | 0.6 V-2 V/0 V | 0 V | 0 V |
| Erase | ~5-13 V | 0 V | 0 V | 0 V | 0 V | 0 V |
| Program | 1-2 V | −0.5 V/0 V | 0.1-3 uA | Vinh ~2.5 V | 4-10 V | 0-1 V/FLT |

Figure 11:
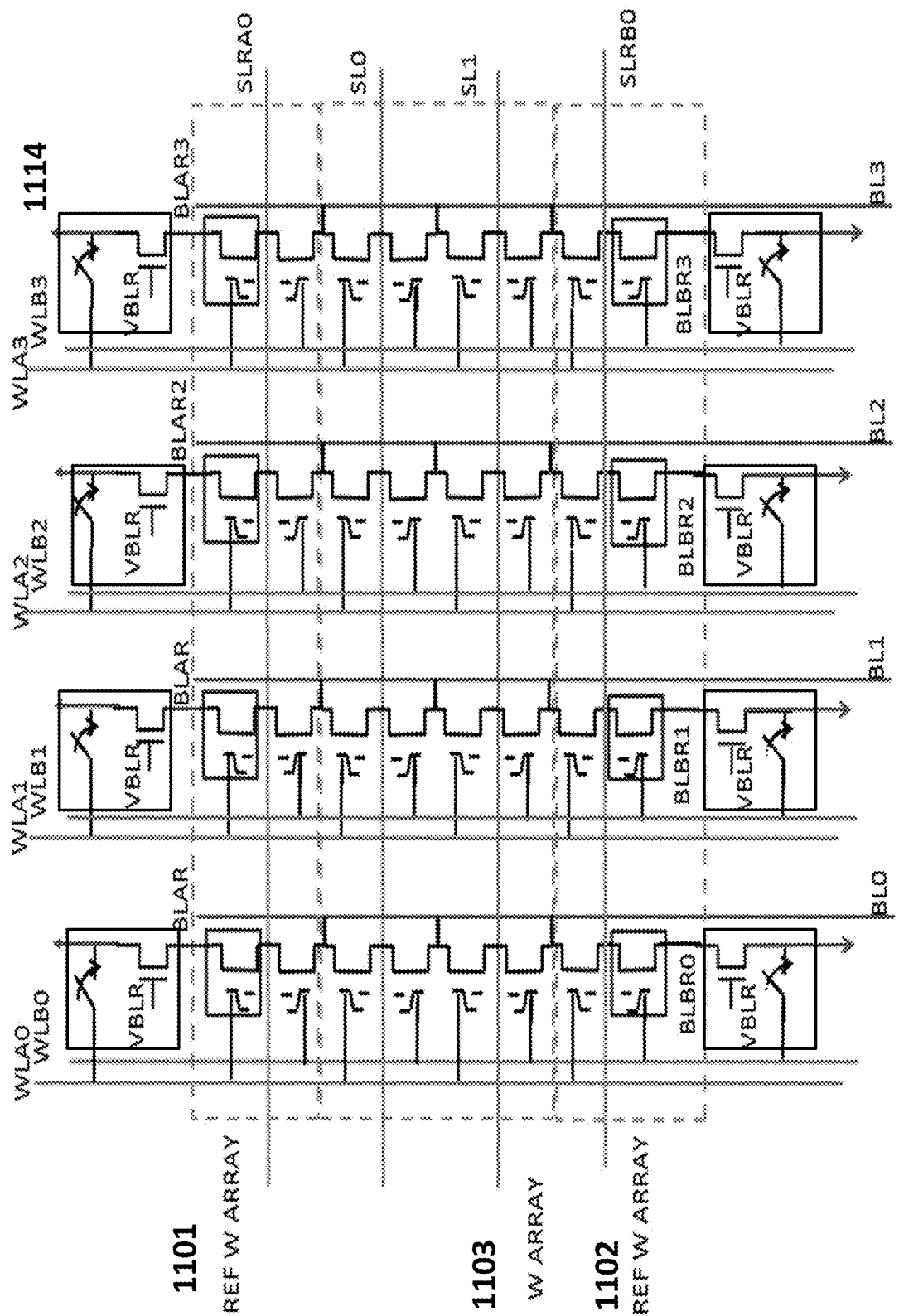
FIG. 11 depicts another embodiment of a vector multiplier matrix.

FIG. 11 depicts neuron VMM array 1100, which is particularly suited for memory cells 210 as shown in FIG. 2, and is utilized as the synapses and parts of neurons between an input layer and the next layer. VMM array 1100 comprises a memory array 1103 of non-volatile memory cells, reference array 1101 of first non-volatile reference memory cells, and reference array 1102 of second non-volatile reference memory cells. Reference arrays 1101 and 1102 run in row direction of the VMM array 1100. VMM array is similar to VMM 1000 except that in VMM array 1100, the word lines run in the vertical direction. Here, the inputs are provided on the word lines (WLA0, WLB0, WLA1, WLB2, WLA2, WLB2, WLA3, WLB3), and the output emerges on the source line (SL0, SL1) during a read operation. The current placed on each source line performs a summing function of all the currents from the memory cells connected to that particular source line.

Table No. 6 depicts operating voltages for VMM array 1100. The columns in the table indicate the voltages placed on word lines for selected cells, word lines for unselected cells, bit lines for selected cells, bit lines for unselected cells, source lines for selected cells, and source lines for unselected cells. The rows indicate the operations of read, erase, and program.

TABLE NO. 6

Operation of VMM Array 1100 of FIG. 11

|  | WL | WL -unsel | BL | BL -unsel | SL | SL -unsel |
|---|---|---|---|---|---|---|
| Read | 1-3.5 V | −0.5 V/0 V | 0.6-2 V | 0.6 V-2 V/0 V | ~0.3-1 V (Ineuron) | 0 V |
| Erase | ~5-13 V | 0 V | 0 V | 0 V | 0 V | SL-inhibit (~4-8 V) |
| Program | 1-2 V | −0.5 V/0 V | 0.1-3 uA | Vinh ~2.5 V | 4-10 V | 0-1 V/FLT |

Figure 12:
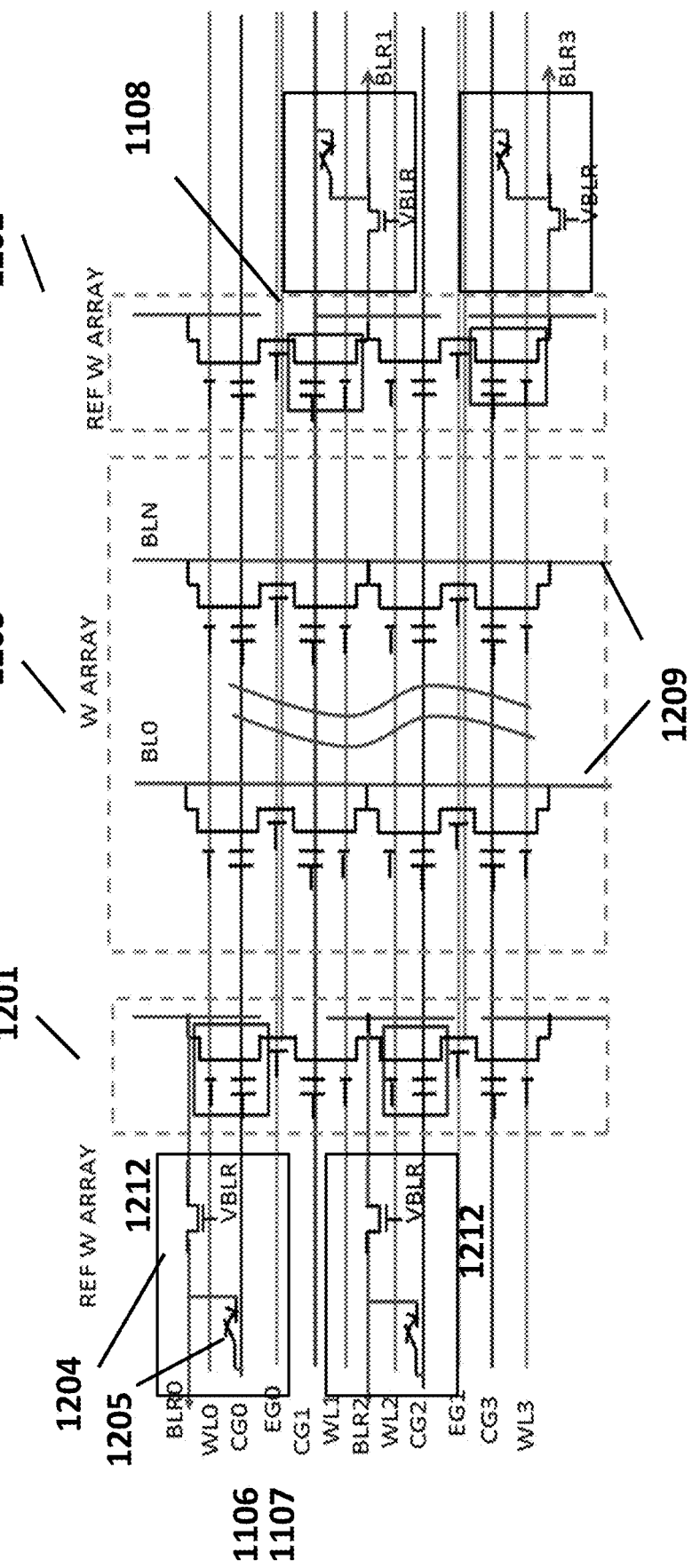
FIG. 12 depicts another embodiment of a vector multiplier matrix.

FIG. 12 depicts neuron VMM array 1200, which is particularly suited for memory cells 310 as shown in FIG. 3, and is utilized as the synapses and parts of neurons between an input layer and the next layer. VMM array 1200 comprises a memory array 1203 of non-volatile memory cells, reference array 1201 of first non-volatile reference memory cells, and reference array 1202 of second non-volatile reference memory cells. Reference arrays 1201 and 1202 serve to convert current inputs flowing into terminals BLR0, BLR1, BLR2, and BLR3 into voltage inputs CG0, CG1, CG2, and CG3. In effect, the first and second non-volatile reference memory cells are diode-connected through multiplexors 1212 with current inputs flowing into them through BLR0, BLR1, BLR2, and BLR3. Multiplexors 1212 each include a respective multiplexor 1205 and a cascoding transistor 1204 to ensure a constant voltage on the bitline (such as BLR0) of each of the first and second non-volatile reference memory cells during a read operation. The reference cells are tuned to target reference levels.

Memory array 1203 serves two purposes. First, it stores the weights that will be used by the VMM array 1200. Second, memory array 1203 effectively multiplies the inputs (current inputs provided to terminals BLR0, BLR1, BLR2, and BLR3, for which reference arrays 1201 and 1202 convert these current inputs into the input voltages to supply to the control gates (CG0, CG1, CG2, and CG3) by the weights stored in the memory array and then add all the results (cell currents) to produce the output, which appears on BL0-BLN, and will be the input to the next layer or input to the final layer. By performing the multiplication and addition function, the memory array negates the need for separate multiplication and addition logic circuits and is also power efficient. Here, the inputs are provided on the control gate lines (CG0, CG1, CG2, and CG3), and the output emerges on the bitlines (BL0-BLN) during a read operation. The current placed on each bitline performs a summing function of all the currents from the memory cells connected to that particular bitline.

VMM array 1200 implements uni-directional tuning for non-volatile memory cells in memory array 1203. That is, each non-volatile memory cell is erased and then partially programmed until the desired charge on the floating gate is reached. This can be performed, for example, using the novel precision programming techniques described below. If too much charge is placed on the floating gate (such that the wrong value is stored in the cell), the cell must be erased and the sequence of partial programming operations must start over. As shown, two rows sharing the same erase gate (such as EG0 or EG1) need to be erased together (which is known as a page erase), and thereafter, each cell is partially programmed until the desired charge on the floating gate is reached.

Table No. 7 depicts operating voltages for VMM array 1200. The columns in the table indicate the voltages placed on word lines for selected cells, word lines for unselected cells, bit lines for selected cells, bit lines for unselected cells, control gates for selected cells, control gates for unselected cells in the same sector as the selected cells, control gates for unselected cells in a different sector than the selected cells, erase gates for selected cells, erase gates for unselected cells, source lines for selected cells, and source lines for unselected cells. The rows indicate the operations of read, erase, and program.

TABLE NO. 7

Operation of VMM Array 1200 of FIG. 12

| | WL | WL - unsel | BL | BL- unsel | CG | Co-unsel same sector | CG unsel | EG | EG- unsel | SL | SL - unsel |
|---|---|---|---|---|---|---|---|---|---|---|---|
| Read | 1.0-2 V | −0.5 V/ 0 V | 0.6-2 V (Ineuron) | 0 V | 0-2.6 V | 0-2.6 V | 0-2.6 V | 0-2.6 V | 0-2.6 V | 0 V | 0 V |
| Erase | 0 V | 0 V | 0 V | 0 V | 0 V | 0-2.6 V | 0-2.6 V | 5-12 V | 0-2.6 V | 0 V | 0 V |
| Program | 0.7-1 V | −0.5 V/ 0 V | 0.1-1 uA | Vinh (1-2 V) | 4-11 V | 0-2.6 V | 0-2.6 V | 4.5-5 V | 0-2.6 V | 4.5-5 V | 0-1 V |

Figure 13:
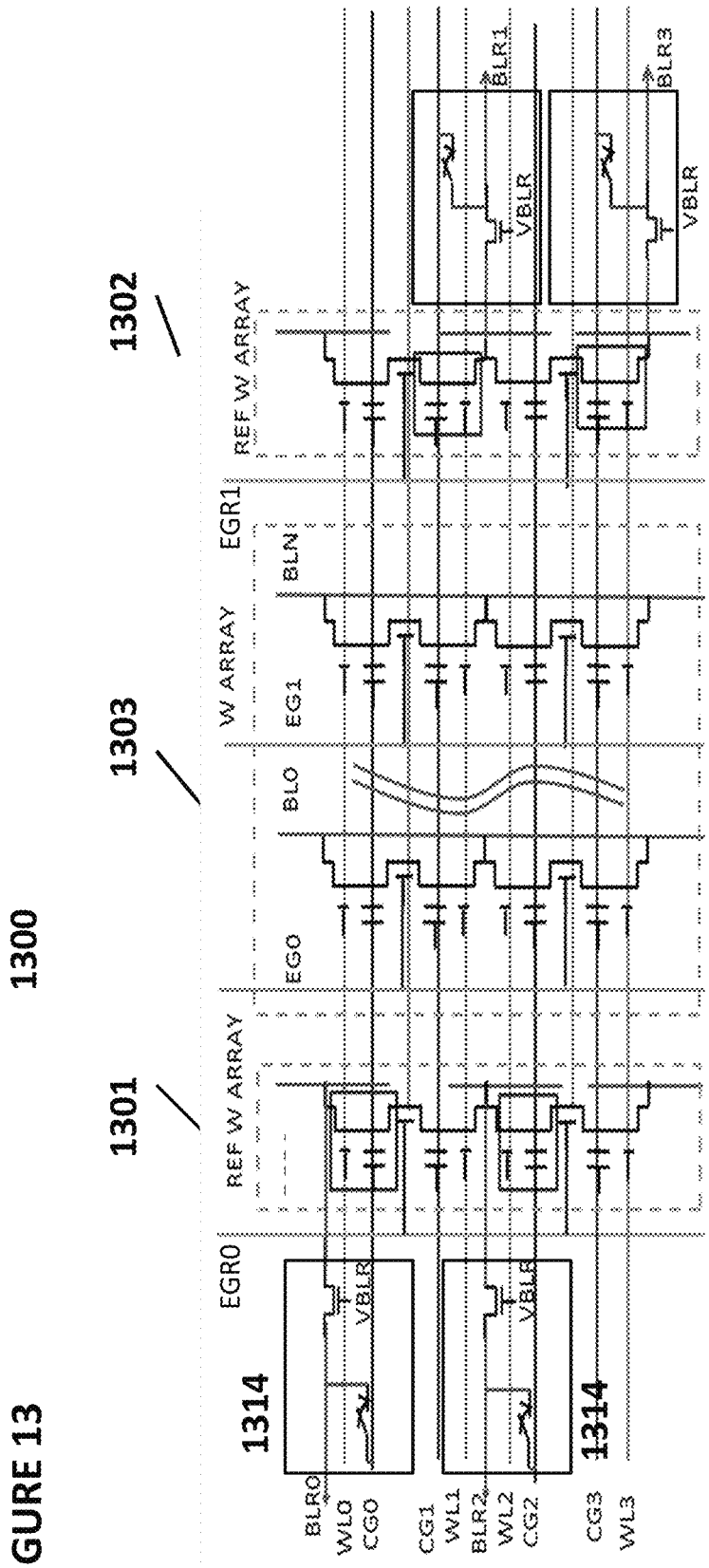
FIG. 13 depicts another embodiment of a vector multiplier matrix.

FIG. 13 depicts neuron VMM array 1300, which is particularly suited for memory cells 310 as shown in FIG. 3, and is utilized as the synapses and parts of neurons between an input layer and the next layer. VMM array 1300 comprises a memory array 1303 of non-volatile memory cells, reference array 1301 or first non-volatile reference memory cells, and reference array 1302 of second non-volatile reference memory cells. EG lines EGR0, EG0, EG1 and EGR1 are run vertically while CG lines CG0, CG1, CG2 and CG3 and SL lines WL0, WL1, WL2 and WL3 are run horizontally. VMM array 1300 is similar to VMM array 1400, except that VMM array 1300 implements bi-directional tuning, where each individual cell can be completely erased, partially programmed, and partially erased as needed to reach the desired amount of charge on the floating gate due to the use of separate EG lines. As shown, reference arrays 1301 and 1302 convert input current in the terminal BLR0, BLR1, BLR2, and BLR3 into control gate voltages CG0, CG1, CG2, and CG3 (through the action of diode-connected reference cells through multiplexors 1314) to be applied to the memory cells in the row direction. The current output (neuron) is in the bitlines BL0-BLN, where each bit line sums all currents from the non-volatile memory cells connected to that particular bitline.

Table No. 8 depicts operating voltages for VMM array 1300. The columns in the table indicate the voltages placed on word lines for selected cells, word lines for unselected cells, bit lines for selected cells, bit lines for unselected cells, control gates for selected cells, control gates for unselected cells in the same sector as the selected cells, control gates for unselected cells in a different sector than the selected cells, erase gates for selected cells, erase gates for unselected cells, source lines for selected cells, and source lines for unselected cells. The rows indicate the operations of read, erase, and program.

Long Short-Term Memory

The prior art includes a concept known as long short-term memory (LSTM). LSTM units often are used in neural networks. LSTM allows a neural network to remember information over predetermined arbitrary time intervals and to use that information in subsequent operations. A conventional LSTM unit comprises a cell, an input gate, an output gate, and a forget gate. The three gates regulate the flow of information into and out of the cell and the time interval that the information is remembered in the LSTM. VMMs are particularly useful in LSTM units.

Figure 14:
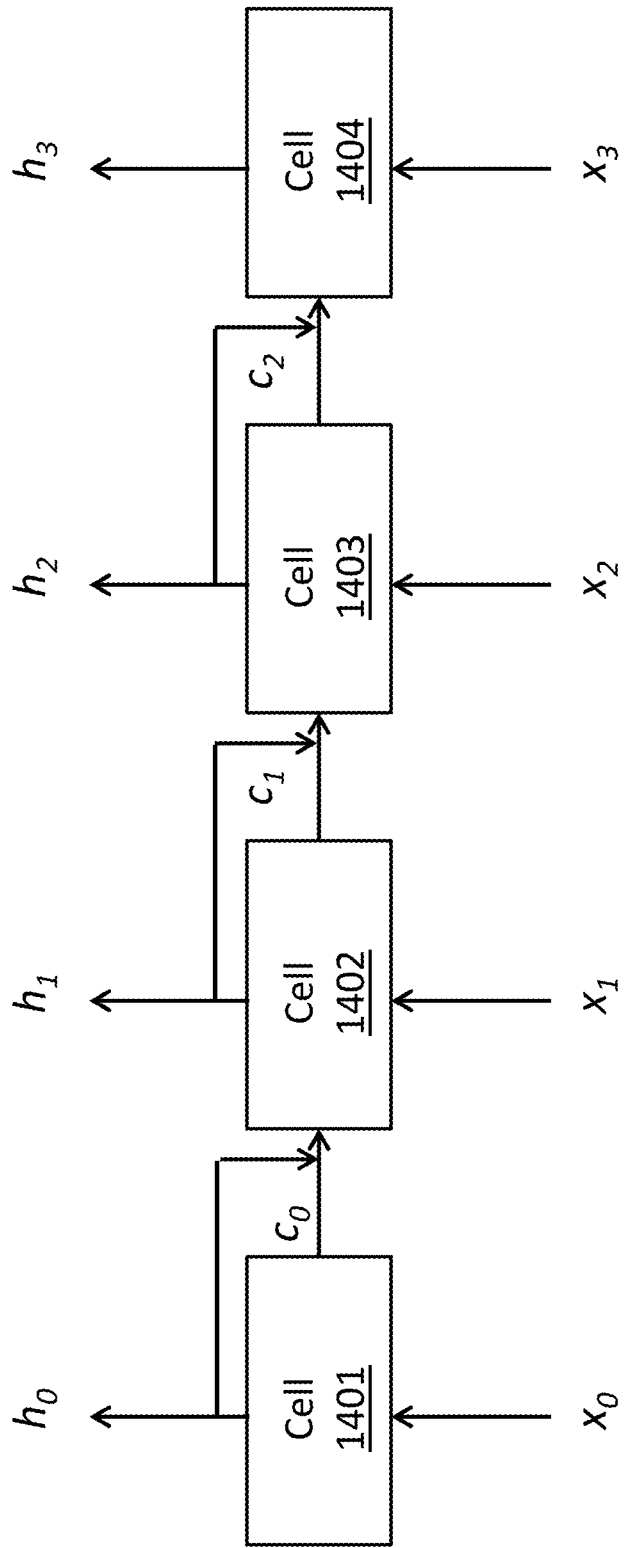
FIG. 14 depicts a prior art long short term memory system.

FIG. 14 depicts an exemplary LSTM 1400. LSTM 1400 in this example comprises cells 1401, 1402, 1403, and 1404. Cell 1401 receives input vector $x_0$ and generates output vector $h_0$ and cell state vector $c_0$. Cell 1402 receives input vector $x_1$, the output vector (hidden state) $h_0$ from cell 1401, and cell state $c_0$ from cell 1401 and generates output vector $h_1$ and cell state vector $c_1$. Cell 1403 receives input vector $x_2$, the output vector (hidden state) $h_1$ from cell 1402, and cell state $c_1$ from cell 1402 and generates output vector $h_2$ and cell state vector $c_2$. Cell 1404 receives input vector $x_3$, the output vector (hidden state) $h_2$ from cell 1403, and cell state $c_2$ from cell 1403 and generates output vector $h_3$. Additional cells can be used, and an LSTM with four cells is merely an example.

Figure 15:
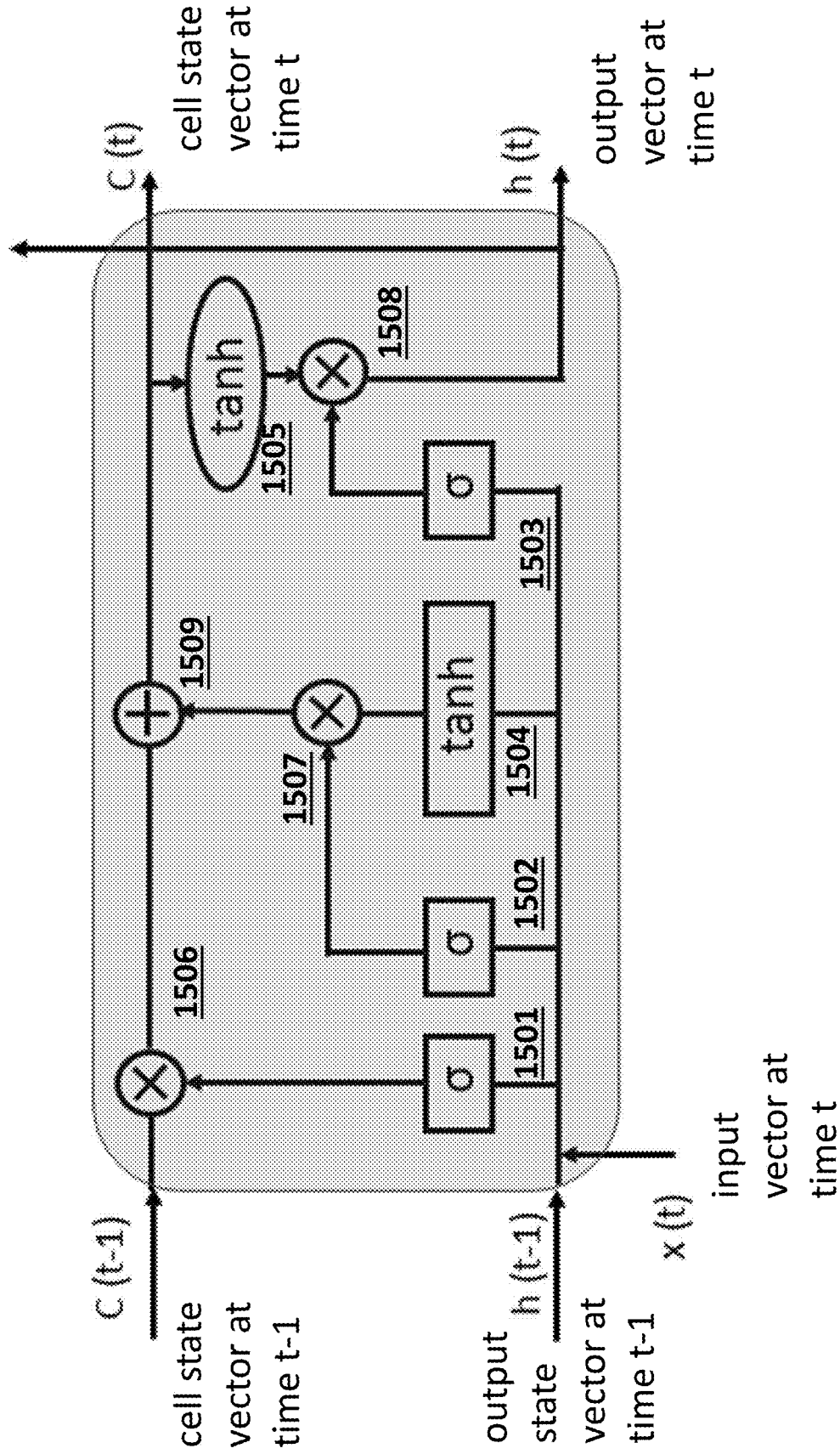
FIG. 15 depicts an exemplary cell in a prior art long short term memory system.

FIG. 15 depicts an exemplary implementation of an LSTM cell 1500, which can be used for cells 1401, 1402, 1403, and 1404 in FIG. 14. LSTM cell 1500 receives input vector x(t), cell state vector c(t−1) from a preceding cell, and output vector h(t−1) from a preceding cell, and generates cell state vector c(t) and output vector h(t).

LSTM cell 1500 comprises sigmoid function devices 1501, 1502, and 1503, each of which applies a number between 0 and 1 to control how much of each component in the input vector is allowed through to the output vector. LSTM cell 1500 also comprises tan h devices 1504 and 1505 to apply a hyperbolic tangent function to an input vector, multiplier devices 1506, 1507, and 1508 to multiply two vectors together, and addition device 1509 to add two vectors together. Output vector h(t) can be provided to the next LSTM cell in the system, or it can be accessed for other purposes.

TABLE NO. 8

Operation of VMM Array 1300 of FIG. 13

| | WL | WL- unsel | BL | BL- unsel | CG | CG -unsel same sector | Co- unsel | EG | EG- unsel | SL | SL- unsel |
|---|---|---|---|---|---|---|---|---|---|---|---|
| Read | 1.0-2 V | −0.5 V/0 V | 0.6-2 V (Ineuron) | 0 V | 0-2.6 V | 0-2.6 V | 0-2.6 V | 0-2.6 V | 0-2.6 V | 0 V | 0 V |
| Erase | 0 V | 0 V | 0 V | 0 V | 0 V | 4-9 V | 0-2.6 V | 5-12 V | 0-2.6 V | 0 V | 0 V |
| Program | 0.7-1 V | −0.5 V/0 V | 0.1-1 uA | Vinh (1-2 V) | 4-11 V | 0-2.6 V | 0-2.6 V | 4.5-5 V | 0-2.6 V | 4.5-5 V | 0-1 V |

Figure 16:
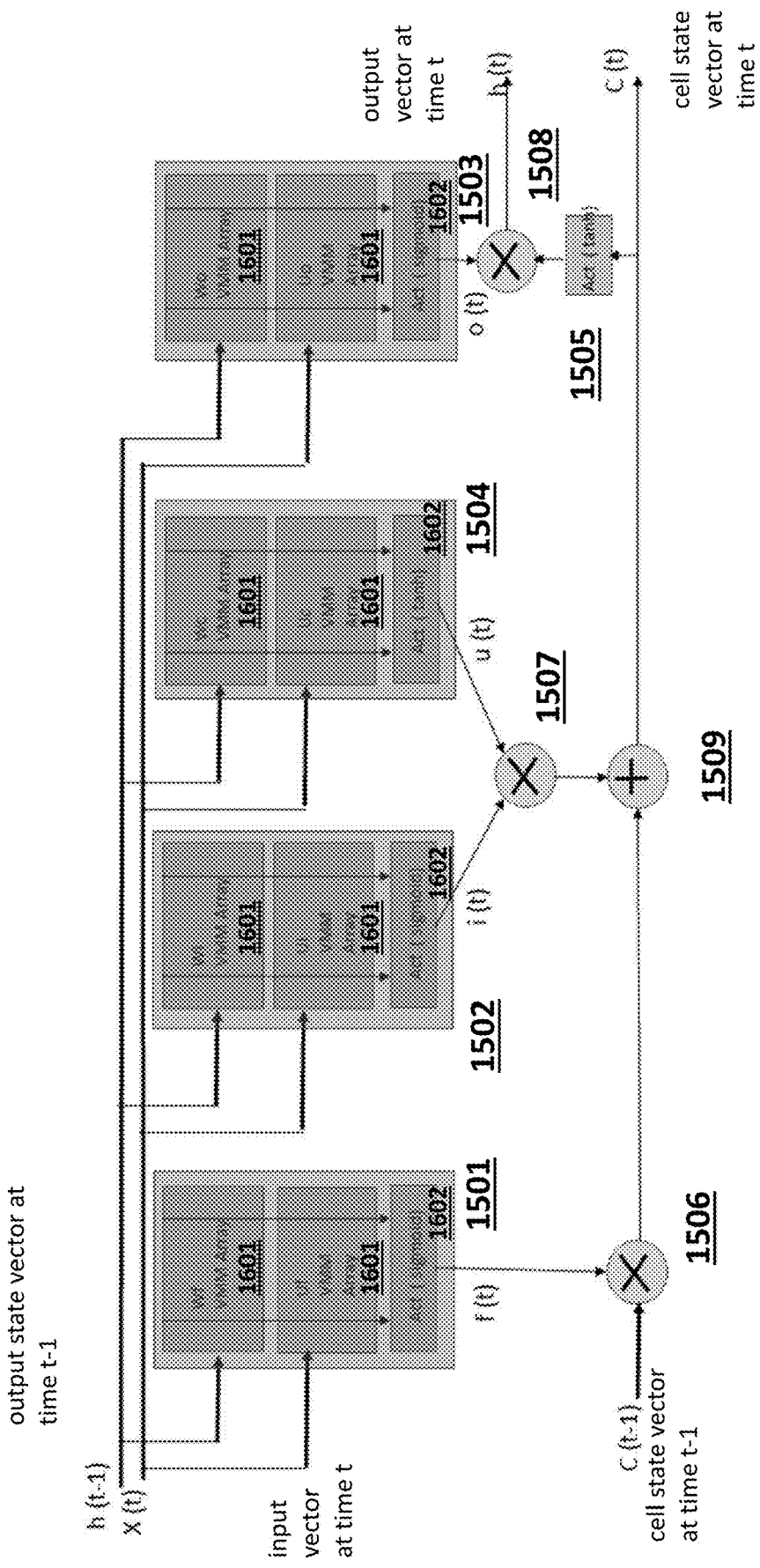
FIG. 16 depicts an implementation of the exemplary cell in a long short term memory system of FIG. 15.

FIG. 16 depicts an LSTM cell 1600, which is an example of an implementation of LSTM cell 1500. For the reader's convenience, the same numbering from LSTM cell 1500 is used in LSTM cell 1600. Sigmoid function devices 1501, 1502, and 1503 and tan h device 1504 each comprise multiple VMM arrays 1601 and activation circuit blocks 1602. Thus, it can be seen that VMM arrays are particular useful in LSTM cells used in certain neural network systems.

Figure 17:
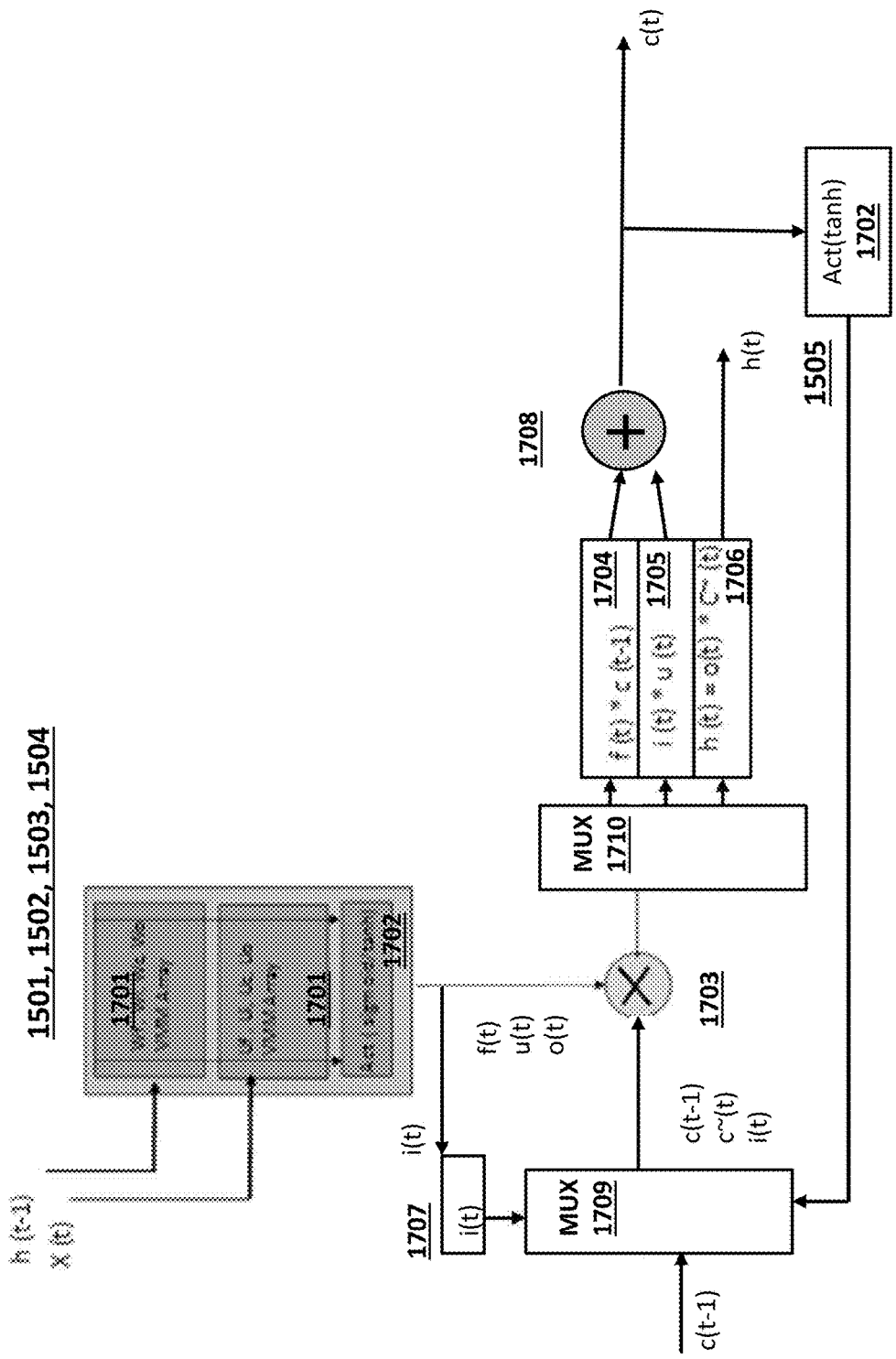
FIG. 17 depicts another implementation of the exemplary cell in a long short term memory system of FIG. 15.

An alternative to LSTM cell 1600 (and another example of an implementation of LSTM cell 1500) is shown in FIG. 17. In FIG. 17, sigmoid function devices 1501, 1502, and 1503 and tan h device 1504 share the same physical hardware (VMM arrays 1701 and activation function block 1702) in a time-multiplexed fashion. LSTM cell 1700 also comprises multiplier device 1703 to multiply two vectors together, addition device 1708 to add two vectors together, tan h device 1505 (which comprises activation circuit block 1702), register 1707 to store the value i(t) when i(t) is output from sigmoid function block 1702, register 1704 to store the value f(t)*c(t-1) when that value is output from multiplier device 1703 through multiplexor 1710, register 1705 to store the value i(t)*u(t) when that value is output from multiplier device 1703 through multiplexor 1710, and register 1706 to store the value o(t)*c~(t) when that value is output from multiplier device 1703 through multiplexor 1710, and multiplexor 1709.

Whereas LSTM cell 1600 contains multiple sets of VMM arrays 1601 and respective activation function blocks 1602, LSTM cell 1700 contains only one set of VMM arrays 1701 and activation function block 1702, which are used to represent multiple layers in the embodiment of LSTM cell 1700. LSTM cell 1700 will require less space than LSTM 1600, as LSTM cell 1700 will require ¼ as much space for VMMs and activation function blocks compared to LSTM cell 1600.

It can be further appreciated that LSTM units will typically comprise multiple VMM arrays, each of which requires functionality provided by certain circuit blocks outside of the VMM arrays, such as a summer and activation circuit block and high voltage generation blocks. Providing separate circuit blocks for each VMM array would require a significant amount of space within the semiconductor device and would be somewhat inefficient. The embodiments described below therefore attempt to minimize the circuitry required outside of the VMM arrays themselves.

Gated Recurrent Units

An analog VMM implementation can be utilized for a GRU (gated recurrent unit) system. GRUs are a gating mechanism in recurrent neural networks. GRUs are similar to LSTMs, except that GRU cells generally contain fewer components than an LSTM cell.

Figure 18:
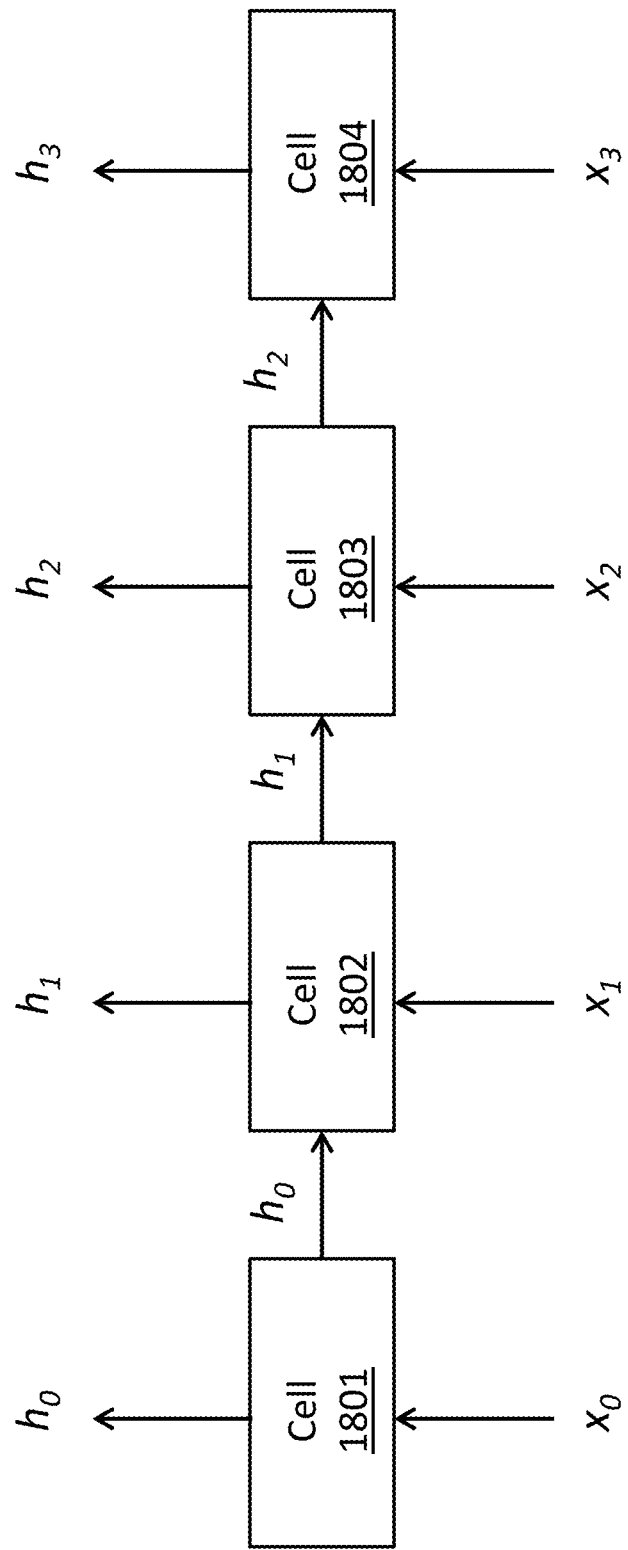
FIG. 18 depicts a prior art gated recurrent unit system.

FIG. 18 depicts an exemplary GRU 1800. GRU 1800 in this example comprises cells 1801, 1802, 1803, and 1804. Cell 1801 receives input vector $x_0$ and generates output vector $h_0$. Cell 1802 receives input vector $x_1$, the output vector (hidden state) $h_0$ from cell 1801 and generates output vector $h_1$. Cell 1803 receives input vector $x_2$ and the output vector (hidden state) $h_1$ from cell 1802 and generates output vector $h_2$. Cell 1804 receives input vector $x_3$ and the output vector (hidden state) $h_2$ from cell 1803 and generates output vector $h_3$, Additional cells can be used, and an GRU with four cells is merely an example.

Figure 19:
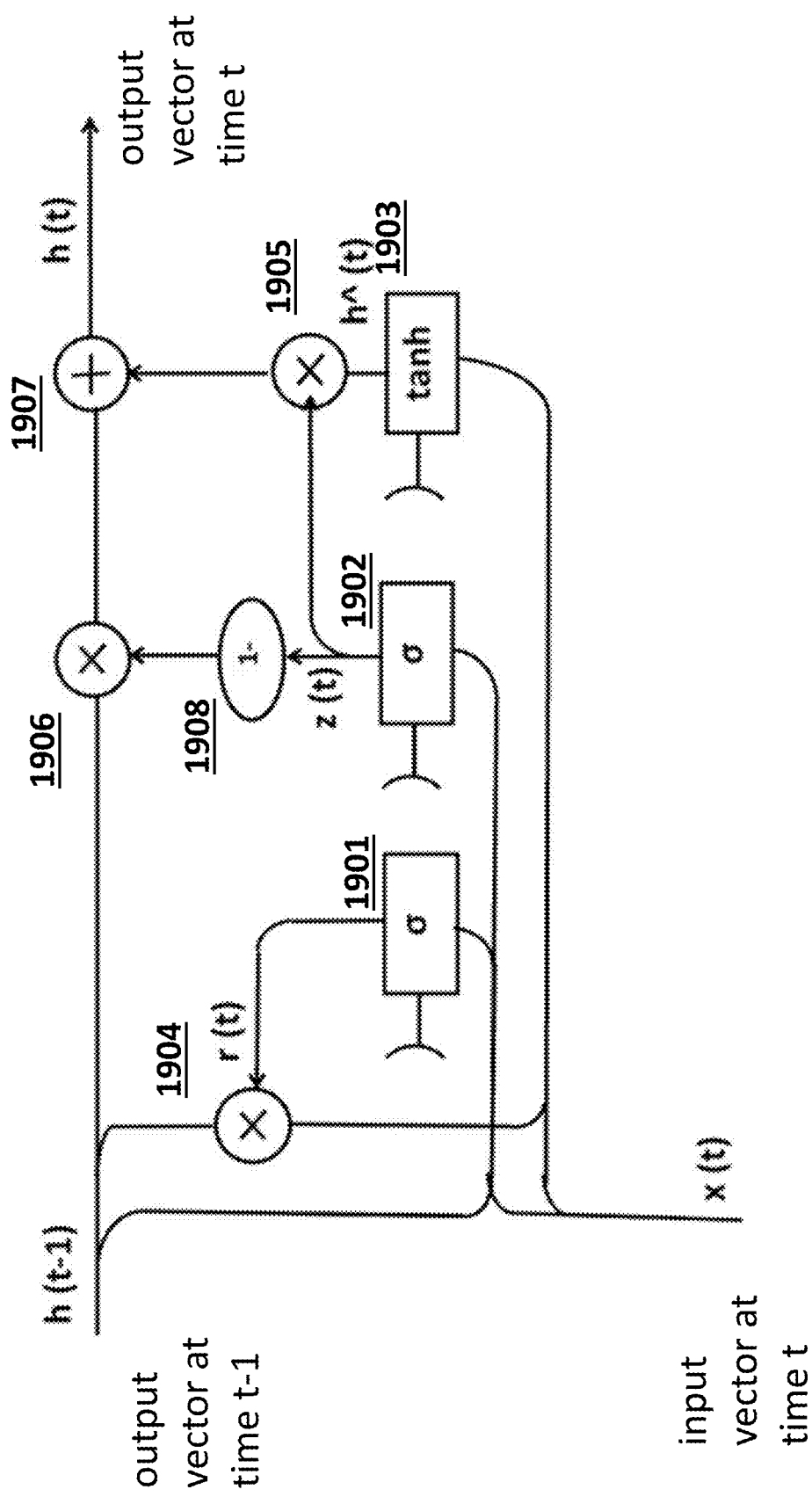
FIG. 19 depicts an exemplary cell in a prior art gated recurrent unit system.

FIG. 19 depicts an exemplary implementation of a GRU cell 1900, which can be used for cells 1801, 1802, 1803, and 1804 of FIG. 18. GRU cell 1900 receives input vector x(t) and output vector h(t-1) from a preceding GRU cell and generates output vector h(t). GRU cell 1900 comprises sigmoid function devices 1901 and 1902, each of which applies a number between 0 and 1 to components from output vector h(t-1) and input vector x(t). GRU cell 1900 also comprises a tan h device 1903 to apply a hyperbolic tangent function to an input vector, a plurality of multiplier devices 1904, 1905, and 1906 to multiply two vectors together, an addition device 1907 to add two vectors together, and a complementary device 1908 to subtract an input from 1 to generate an output.

Figure 20:
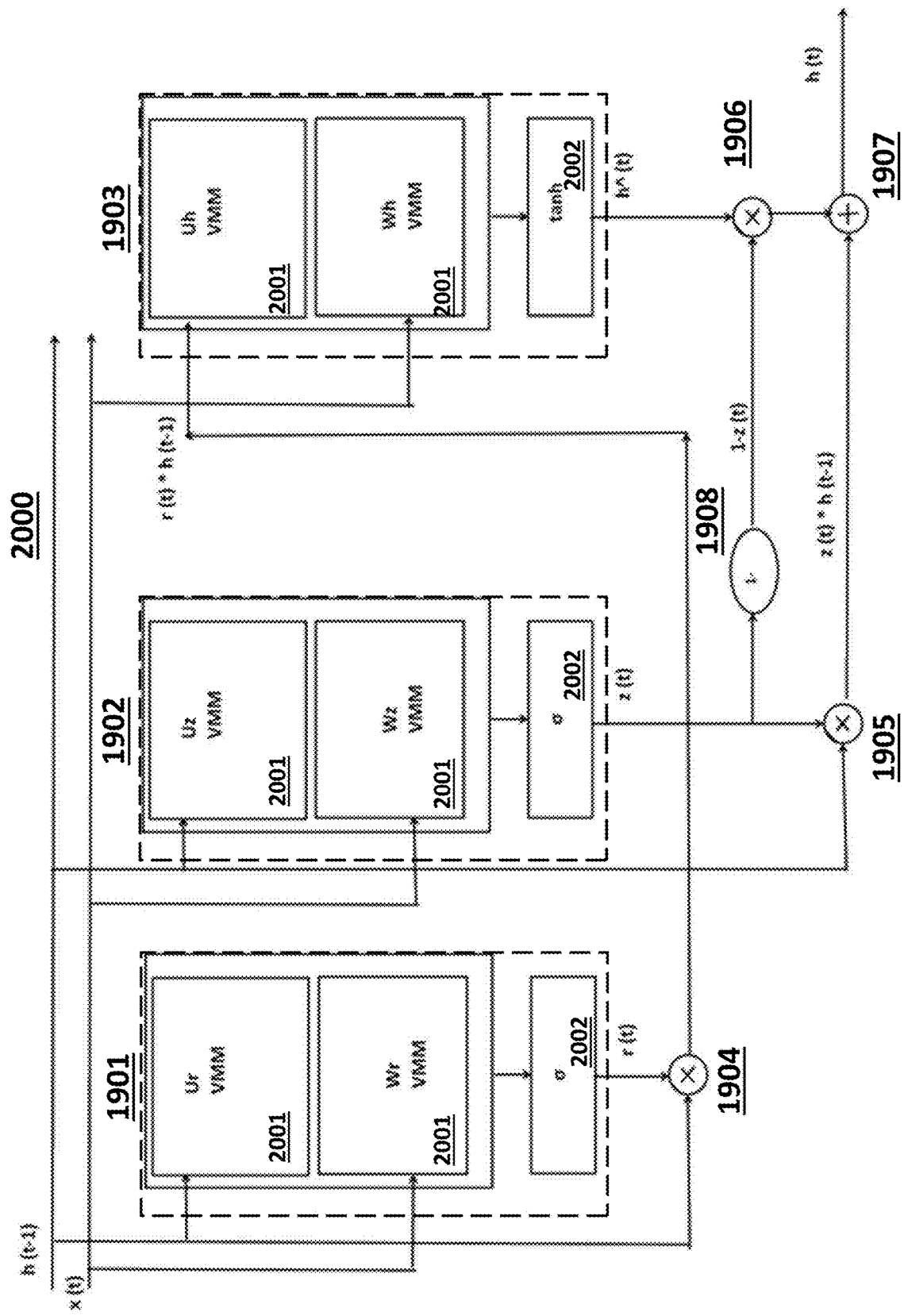
FIG. 20 depicts an implementation of the exemplary cell in the gated recurrent unit system of FIG. 19.

FIG. 20 depicts a GRU cell 2000, which is an example of an implementation of GRU cell 1900. For the reader's convenience, the same numbering from GRU cell 1900 is used in GRU cell 2000. As can be seen in FIG. 20, sigmoid function devices 1901 and 1902, and tan h device 1903 each comprise multiple VMM arrays 2001 and activation function blocks 2002. Thus, it can be seen that VMM arrays are of particular use in GRU cells used in certain neural network systems.

Figure 21:
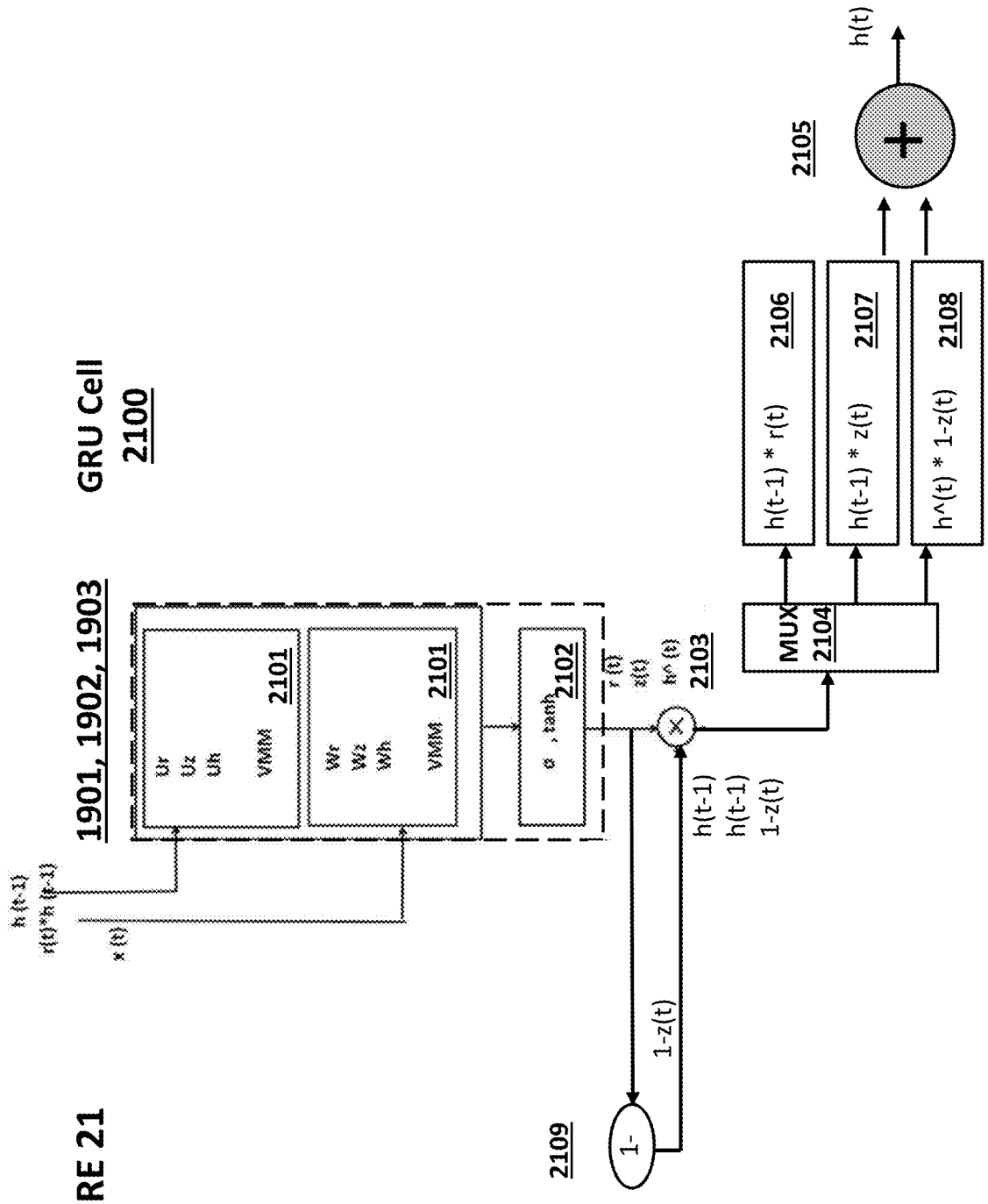
FIG. 21 depicts another embodiment of the exemplary cell in the gated recurrent unit system of FIG. 19.

An alternative to GRU cell 2000 (and another example of an implementation of GRU cell 1900) is shown in FIG. 21. In FIG. 21, GRU cell 2100 utilizes VMM arrays 2101 and activation function block 2102, which when configured as a sigmoid function applies a number between 0 and 1 to control how much of each component in the input vector is allowed through to the output vector. In FIG. 21, sigmoid function devices 1901 and 1902 and tan h device 1903 share the same physical hardware (VMM arrays 2101 and activation function block 2102) in a time-multiplexed fashion. GRU cell 2100 also comprises multiplier device 2103 to multiply two vectors together, addition device 2105 to add two vectors together, complementary device 2109 to subtract an input from 1 to generate an output, multiplexor 2104, register 2106 to hold the value h(t-1)*r(t) when that value is output from multiplier device 2103 through multiplexor 2104, register 2107 to hold the value h(t-1)*z(t) when that value is output from multiplier device 2103 through multiplexor 2104, and register 2108 to hold the value h^(t)*(1-z(t)) when that value is output from multiplier device 2103 through multiplexor 2104.

Whereas GRU cell 2000 contains multiple sets of VMM arrays 2001 and activation function blocks 2002, GRU cell 2100 contains only one set of VMM arrays 2101 and activation function block 2102, which are used to represent multiple layers in the embodiment of GRU cell 2100. GRU cell 2100 will require less space than GRU cell 2000, as GRU cell 2100 will require ⅓ as much space for VMMs and activation function blocks compared to GRU cell 2000.

It can be further appreciated that GRU systems will typically comprise multiple VMM arrays, each of which requires functionality provided by certain circuit blocks outside of the VMM arrays, such as a summer and activation circuit block and high voltage generation blocks. Providing separate circuit blocks for each VMM array would require a significant amount of space within the semiconductor device and would be somewhat inefficient. The embodiments described below therefore attempt to minimize the circuitry required outside of the VMM arrays themselves.

The input to the VMM arrays can be an analog level, a binary level, or digital bits (in this case a DAC is needed to convert digital bits to appropriate input analog level) and the output can be an analog level, a binary level, or digital bits (in this case an output ADC is needed to convert output analog level into digital bits).

For each memory cell in a VMM array, each weight w can be implemented by a single memory cell or by a differential cell or by two blend memory cells (average of 2 cells). In the differential cell case, two memory cells are needed to implement a weight w as a differential weight (w=w+−w−). In the two blend memory cells, two memory cells are needed to implement a weight w as an average of two cells.

Flash Analog Neuromorphic Memory Shared Architecture System

Figure 22:
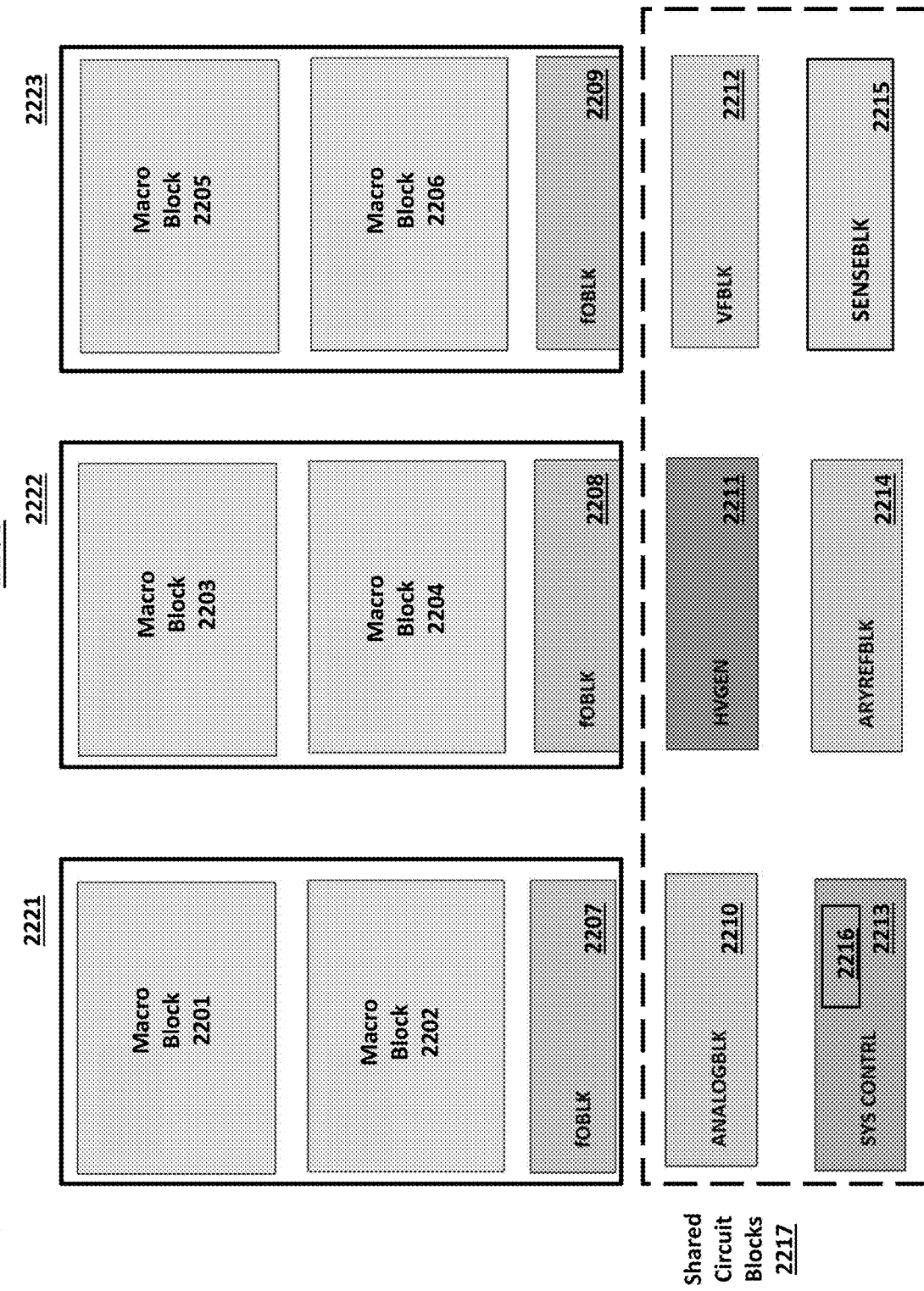
FIG. 22 depicts a flash analog neuromorphic memory shared architecture system.

FIG. 22 depicts flash analog neuromorphic memory shared architecture system 2200, which comprises VIM systems 2221, 2222, and 2223 and shared circuit blocks 2217. VMM system 2221 comprises macro blocks 2201 and 2202 and output block 2207, the latter of which can comprise a summer, an analog-to-digital converter, or another type of functional block, and provides an output for macro blocks 2201 and 2202. VMM system 2222 comprises macro blocks 2203 and 2204 and output block 2208, the latter of which can comprise a summer, an analog-to-digital converter, or another type of functional block, and provides an output for macro blocks macro blocks 2203 and 2204. VMM system 2223 comprises macro blocks 2205 and 2206 and output block 2209, the latter of which can comprise a summer, an analog-to-digital converter, or another type of functional block, and provides an output for macro blocks macro blocks 2205 and 2206. As discussed in greater detail with respect to FIG. 23, each macro block, such as macro blocks 2201, 2202, 2203, 2204, 2205, and 2206, contain one VMM array.

Shared circuit blocks 2217 are used by VIM systems 2221, 2222, and 2223. In this example, shared circuit blocks 2217 include:

analog circuit block 2210;
high voltage generation block 2211;
verify block 2212;
system control block 2213;
array reference block 2214; and
sensing block 2215.

Analog circuit block 2210 contains analog circuitry for performing certain analog functions required by macro blocks 2201, 2202, 2203, 2204, 2205, and 2206 during operation such as to provide reference voltage, timing, and current for program, erase, read, and verify operation. Verify operation is used to confirm a target weight (meaning certain floating gate charge) is reached during erase or program.

High voltage generation block 2211 provides various high voltages required by macro blocks 2201, 2202, 2203, 2204, 2205, and 2206 during various operations, such as program operations and erase operations. Optionally, high voltage generation block 2211 provides those high voltages concurrently (with sufficient voltage and current) to two or more of macro blocks 7201, 2707, 2203, 7704, 2205, and 2206, and optionally, program operations can occur concurrently within two or more of macro blocks 2201, 2202, 2203, 2204, 2205, and 2206 in response to a single command or multiple commands, and optionally, erase operations can occur concurrently within two or more of macro blocks 2201, 2202, 2203, 2204, 2205, and 2206 in response to a single command or multiple commands.

Verify block 2212 performs a verify operation as part of a write-and-verify operation on macro blocks 2201, 2202, 2203, 2204, 2205, and 2206 or a portion thereof during write operations. Optionally, the verify block 2212 can perform verify operations concurrently on two or more of macro blocks 2201, 2202, 2203, 2204, 2205, and 2206. Verify block 2212 comprises a sensing block (such as the sensing portion of program and sensing block 2900 depicted in FIG. 29).

System control block 2213 provides various system control functions, such as trimming of various components (such as the adjustable resistors, transistors, and current sources discussed below) using trimming block 2216, as well as testing. It also provides macro/core interface command control logic and write algorithm. It also provides control logic for component sharing across multiple macros or cores.

Array reference block 2214 provides reference memory cells for use during sense or verify operations within macro blocks 2201, 2202, 2203, 2204, 2205, and 2206. Alternatively, the sense or verify may use reference levels provided by a resistor, a MOSFET, or a bandgap-based bias.

Sensing block 2215 performs a sense operation on macro blocks 2201, 2202, 2203, 2204, 2205, and 2206 or a portion thereof during write operations. Optionally, sensing block 2215 can perform sense operations concurrently on two or more of macro blocks 2201, 2202, 2203, 2204, 2205, and 2206. Sensing block 2215 can comprise the sensing portion of program and sensing block 2900 depicted in FIG. 29.

Table 9 depicts operation modes for flash analog neuromorphic memory shared architecture system 2200 of FIG. 22. The columns in the table shown indicate (in order from left to right) the state of high voltage generation block 2211, verify block 2212, summer and activation circuit blocks 2207, 2208, and 2209, analog circuit block 2210, array reference block 2214, and each of the VMM systems contained in system 2200. Macro mode selection is for MACRO1 (which is a selected macro block, such as macro block 2201, 2202, 2203, 2204, 2205, or 2206). In system mode, MACRO is on if selected.

The rows in the table shown indicate (in order from top to bottom):

system mass erase operation, where selected cells in all selected macros in system 2200 are erased);

system mass program operation, where selected cells in all selected macros in system 2200 are programmed; program high voltage compensation done per macro (using a macro high voltage compensation block), meaning compensation is done locally at the macro level, for example at each macro, Icomp=number of unprogrammed bits*Iprog; alternatively high voltage compensation is done per system level (using a system level high voltage compensation block), for example in this case the macro with the most un-programmed bit is used to compensate at the high voltage generation circuit (hvgen), for example at the hvgen, Icomp=number of unprogrammed bits*Iprog.

system read/verify operation, where selected cells in all selected macros in system 2200 are read and verified; for reading '0' (programmed state) for multiple cells in multiple cores, a reference '0' margin I–M0 current is used in current sensing to detect if summed selected cell current >I–M0, then it fails reading '0'; for reading '1' (programmed state) for multiple cells in multiple cores, a reference '1' margin k*I–M1 current is used in current sensing to detect if summed selected cell current <k*I–M1, then it fails reading '1', for example for reading 2 cells in parallel, k=2.

macro erase operation, where only one macro block, here the one labeled MACRO1, is erased; a sector (consisting of multiple rows) can be erased with a macro sector erase or whole array can be erased by a macro mass erase.

macro program operation, where only one macro block, here the one labeled MACRO1, is programmed; a word (consisting of multiple cells in multiple columns) can be programmed with a macro word programmed or selected mass array with multiple rows and/or multiple columns can be programmed by a macro mass program.

macro read/verify operation, where only one macro block, here the one labeled MACRO1, is read and verified; and read neural operation, where all cells in a single macro block are read at one time.

TABLE NO. 9

Operation Modes For Flash Analog Neuromorphic Memory Shared Architecture System 2200 of FIG. 22

| MODE | HVGEN | VFYBLK | fOBLK | ANABLK | ARYREFBLK |
|---|---|---|---|---|---|
| System Mass Erase | ON | OFF | OFF | ON | OFF |
| System Mass Program | ON | OFF | OFF | ON | OFF |
| System Read Verify | OFF | ON | OFF | ON | ON |
| Macro Erase (Sector/Mass) | ON | OFF | OFF | ON | OFF |
| Macro Program (Word/Mass) | ON | OFF | OFF | ON | OFF |
| Macro Read Verify (Word/Mass) | OFF | ON | OFF | ON | ON |
| Read Neural | OFF | OFF | ON | ON | ON |

| MODE | MACRO1 | MACRO2 | MACRON-1 | MACRON |
|---|---|---|---|---|
| System Mass Erase | Y (sel) | Y (sel) | Y (sel) | Y (sel) |
| System Mass Program | Y (sel) | Y (sel) | Y (sel) | Y (sel) |
| System Read Verify | Y (sel) | Y (sel) | Y (sel) | Y (sel) |
| Macro Erase (Sector/Mass) | Y (sel) | N (unsel) | N (unsel) | N (unsel) |
| Macro Program (Word/Mass) | Y (sel) | N (unsel) | N (unsel) | N (unsel) |
| Macro Read Verify (Word/Mass) | Y (sel) | N (unsel) | N (unsel) | N (unsel) |
| Read Neural | Y | Y | Y | Y |

Figure 23:
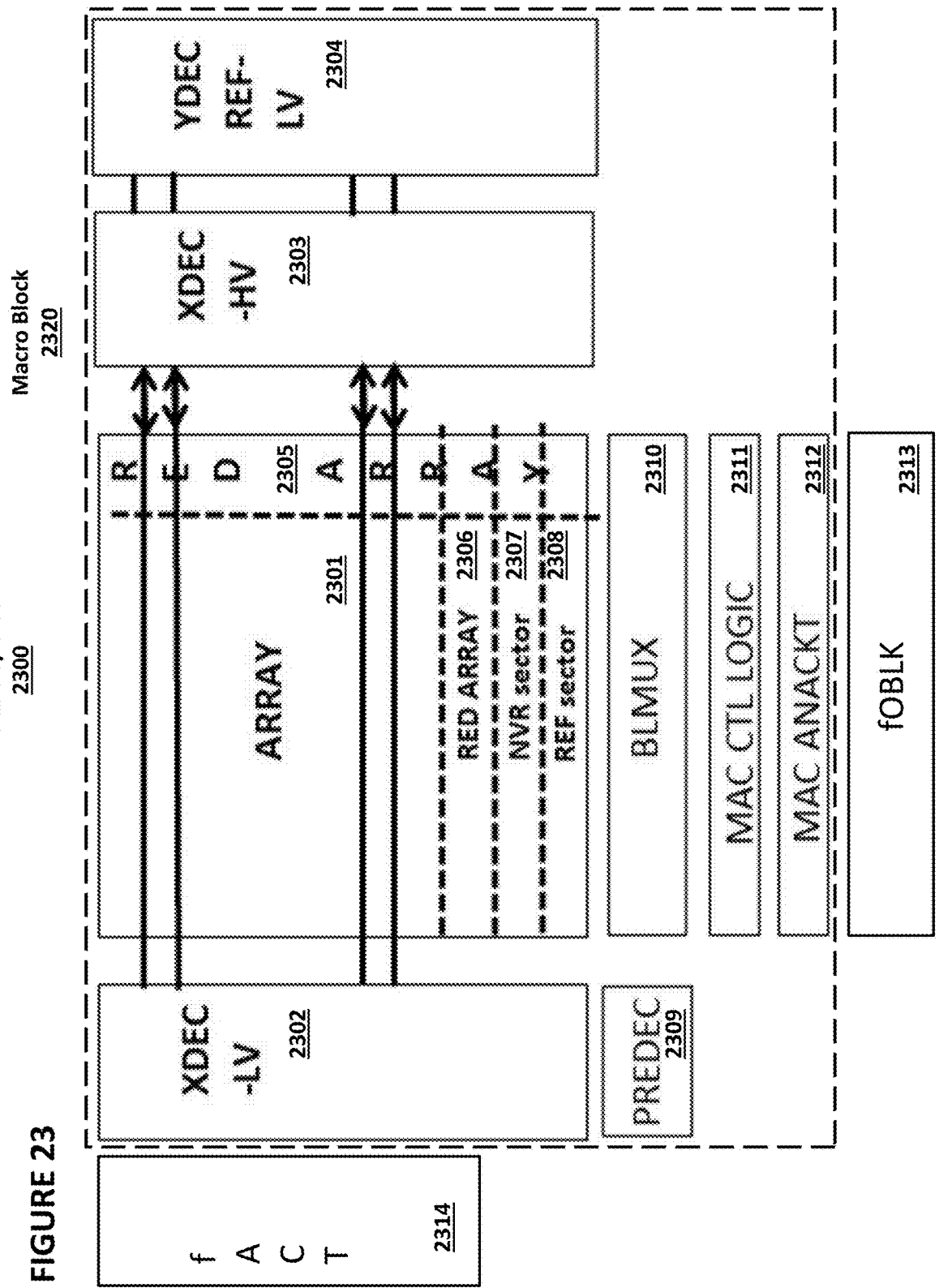
FIG. 23 depicts a VMM system within the flash analog neuromorphic memory shared architecture system of FIG. 22.

FIG. 23 depicts VMM system 2300 (which can be used to implement VMM systems 2221, 2222, and 2223 in FIG. 22). VMM system 2300 comprises macro block 2320 (which can be used to implement macro blocks 2201, 2202, 2203, 2204, 2205, and 2206 in FIG. 22) and activation function block 2314 and output block 2313, the latter of which can comprise a summer, analog-to-digital converter, or another type of functional block, and provides an output for VMM system 2300.

Macro block 2320 comprises VMM array 2301, low voltage row decoder 2302, high voltage row decoder 2303, and low voltage reference column decoder 2304. Low voltage row decoder 2302 provides a bias voltage for read and program operations and provides a decoding signal for high voltage row decoder 2303. High voltage row decoder 2303 provides a high voltage bias signal for program and erase operations.

Macro block 2320 further comprises redundancy arrays 2305 and 2306. Redundancy arrays 2305 and 2306 provides array redundancy for replacing a defective portion in array 2301. VMM system 2300 further comprises NVR (non-volatile register, aka info sector) sector 2307, which are array sectors used to store, inter alia, user info, device ID, password, security key, trimbits, configuration bits, manufacturing info. Macro block 2320 further comprises reference sector 2308 for providing reference cells to be used in a sense operation; predecoder 2309 for decoding addresses for decoders 2302, 2303, and/or 2304; bit line multiplexor 2310; macro control logic 2311; and macro analog circuit block 2312, each of which performs functions at the macro block or VMM array level (as opposed to the system level comprising all VMM arrays).

Examples of embodiments of the circuit blocks shown in FIGS. 22 and 23 will now be described.

Figure 24:
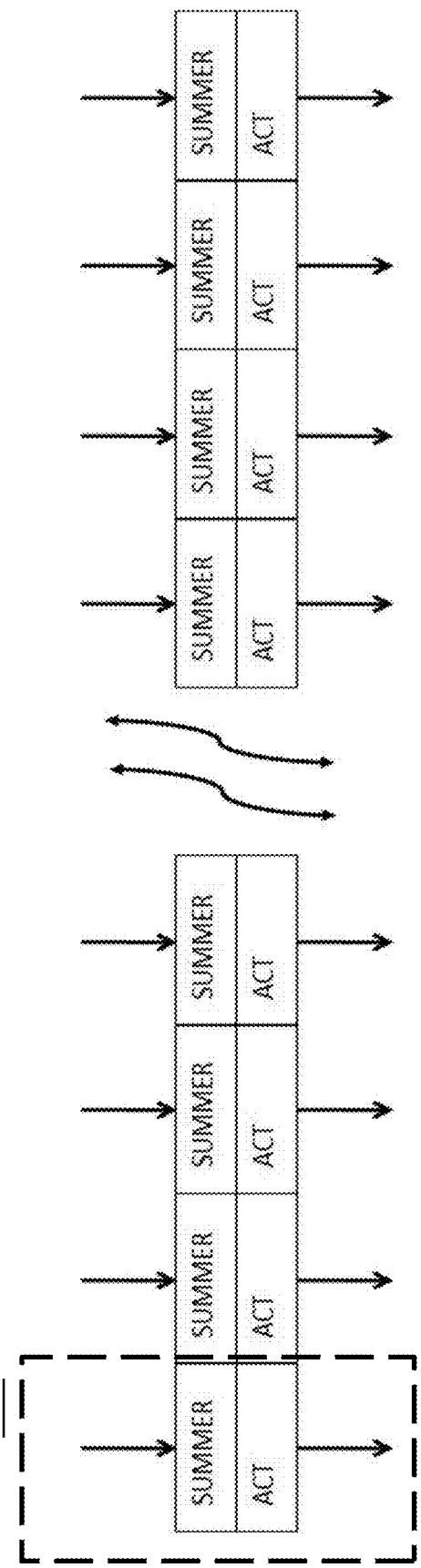
FIG. 24 depicts an output block for use in the flash analog neuromorphic memory shared architecture system of FIG. 22.

FIG. 24 depicts output block 2400 (which can be used as output blocks 2207, 2208, 2209 in FIG. 22 and output block 2313 in FIG. 23). In this example, output block 2400 comprises a plurality of individual summer and activation circuit blocks such as summer and activation block 2401.

Figure 25:
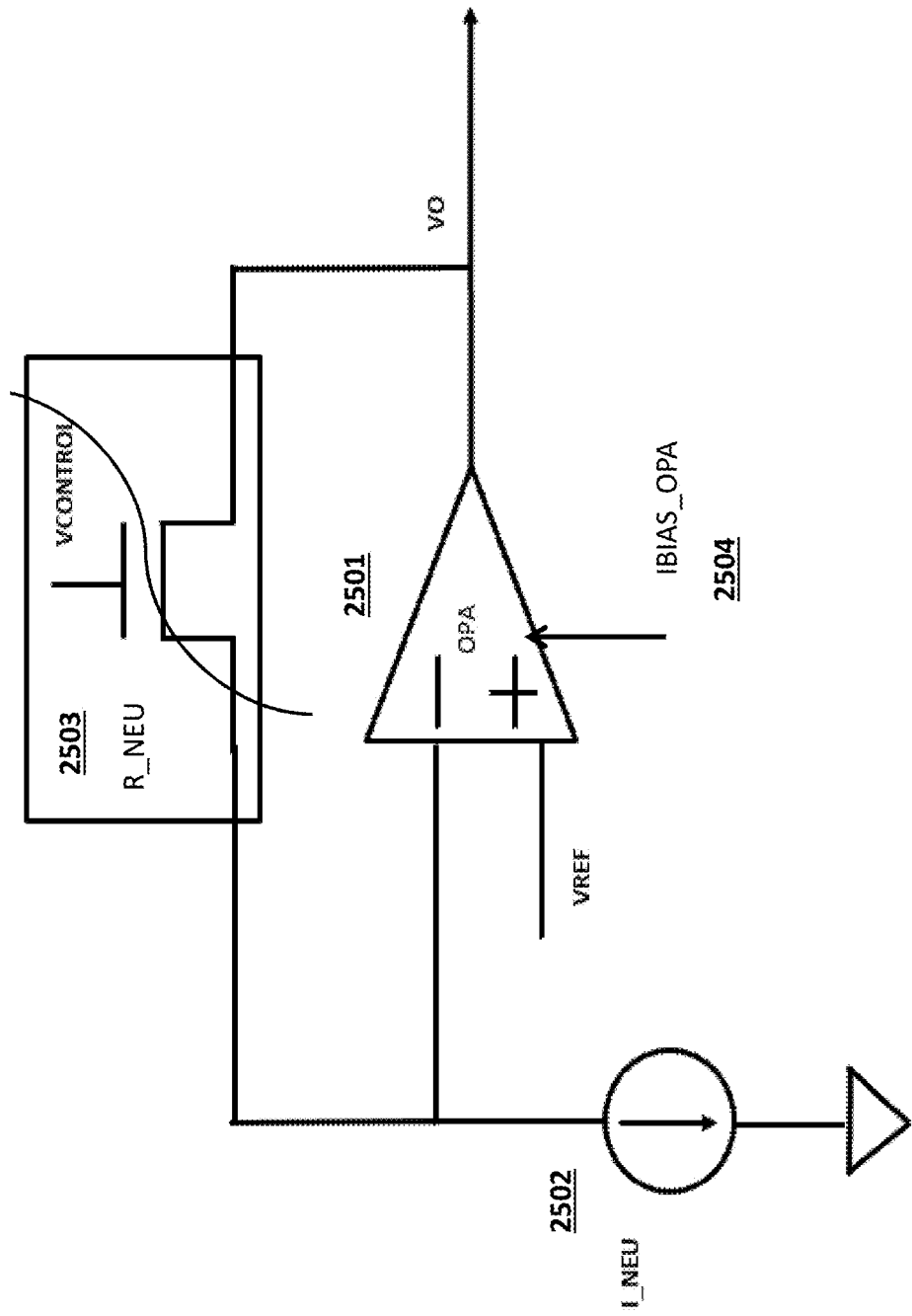
FIG. 25 depicts an adaptable neuron for use in the flash analog neuromorphic memory shared architecture system of FIG. 22.
Figure 26:
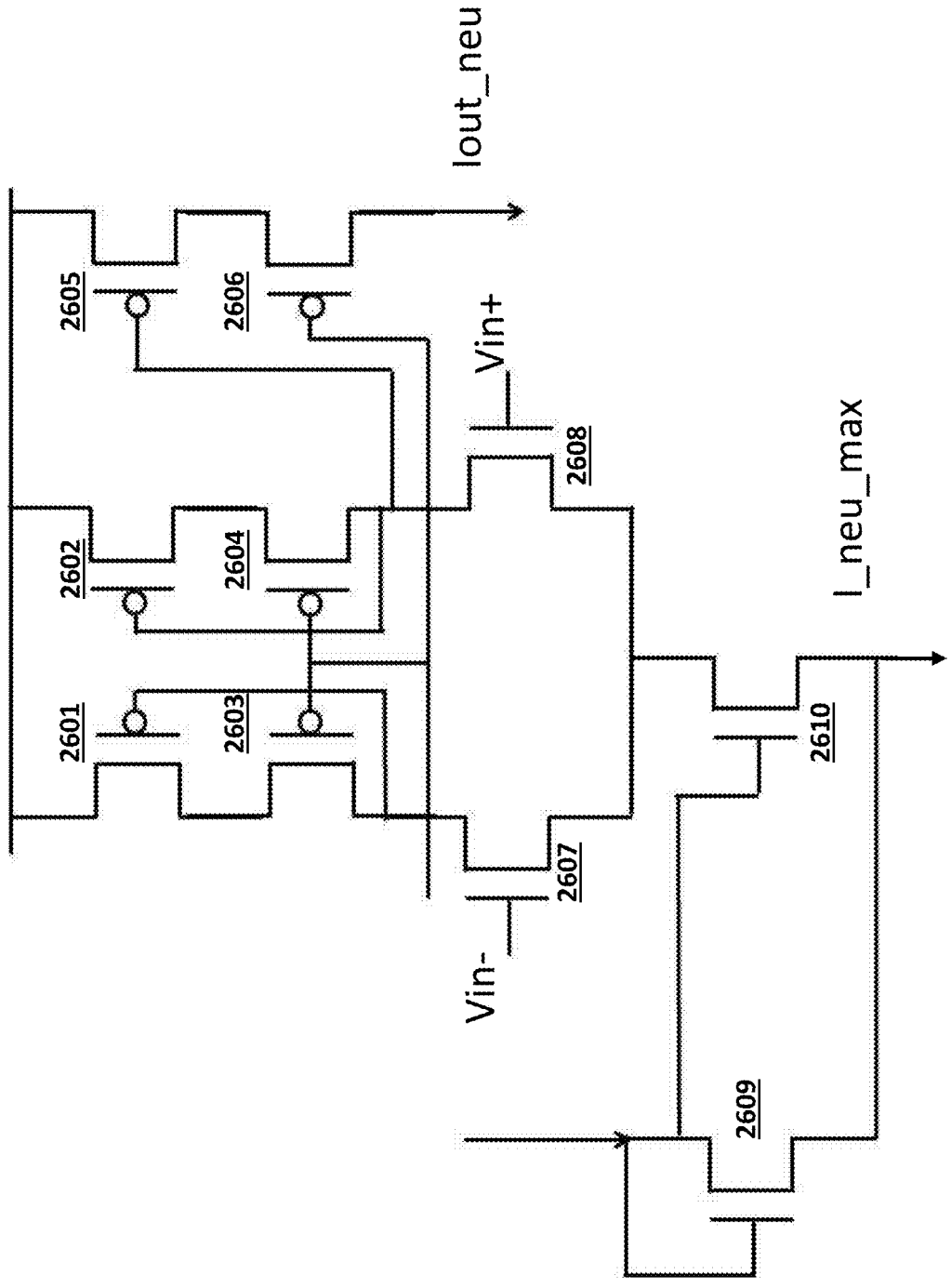
FIG. 26 depicts an activation function circuit for use in the flash analog neuromorphic memory shared architecture system of FIG. 22.

FIG. 25 depicts adaptable neuron circuit 2500 that comprises on an op amp that provides low impedance output, for summing multiple current signals and converting the summed current signal into a voltage signal, and which is an embodiment of each summer block within summer block 2601a, . . . , 2601i in FIG. 26. Adaptable neuron circuit 2500 receives current from a VMM, such as VMM array 2401 (labeled I_NEU), which here is represented as current source 2502, which is provided to the inverting input of operational amplifier 2501. The non-inverting input of operational amplifier 2501 is coupled to a voltage source (labeled VREF). The output (labeled VO) of operational amplifier 2501 is coupled to NMOS R_NEU transistor 2503, which acts as a variable resistor of effective resistance R_NEU in response to the signal VCONTROL, which is applied to the gate of NMOS transistor 2503. The output voltage, Vo, is equal to I_NEU*R_NEU−VREF. The maximum value of I_NEU depends on the number of synapses and weight value contained in the VMM. R_NEU is a variable resistance and can be adapted to the VMM size it is coupled to. Further, the power of the summing operational amplifier 2501 is adjusted in relation the value of the R_NEU transistor 2503 to minimize power consumption. As the value of R_NEU transistor 2503 increases, the bias (i.e., power) of the operational amplifier 2501 is reduced via current bias IBIAS_OPA 2504 and vice versa. Since the op amp based summer circuit can provide low impedance output, it is suitable to be configured to drive a long interconnect and heavier loading.

FIG. 26 depicts activation function circuit 2600. Activation function circuit 2600 can be used for activation circuit blocks 2203a, 2203b, 2203c, 2203d, 2203e, and 2203f in FIG. 22 and activation circuit blocks 2303a, 2303b, 2303c, 2303d, 2303e, and 2303f in FIG. 23, and activation block 2414 in FIG. 24.

Activation function circuit 2600 converts an input voltage pair (Vin+ and Vin−) into a current (Iout_neu) using a tan h function, and which can be used with the VMM arrays described above. Activation function circuit 2600 comprises PMOS transistors 2601, 2602, 2603, 2604, 2605, and 2606 and NMOS transistors 2607, 2608, 2609, and 2610, configured as shown. The transistors 2603, 2604, and 2606 serve as cascoding transistors. The input NMOS pair 2607 and 2608 operates in sub-threshold region to realize the tan h function. The current I_neu_max is the maximum neuron current that can be received from the attached VMM (not shown).

Figure 27:
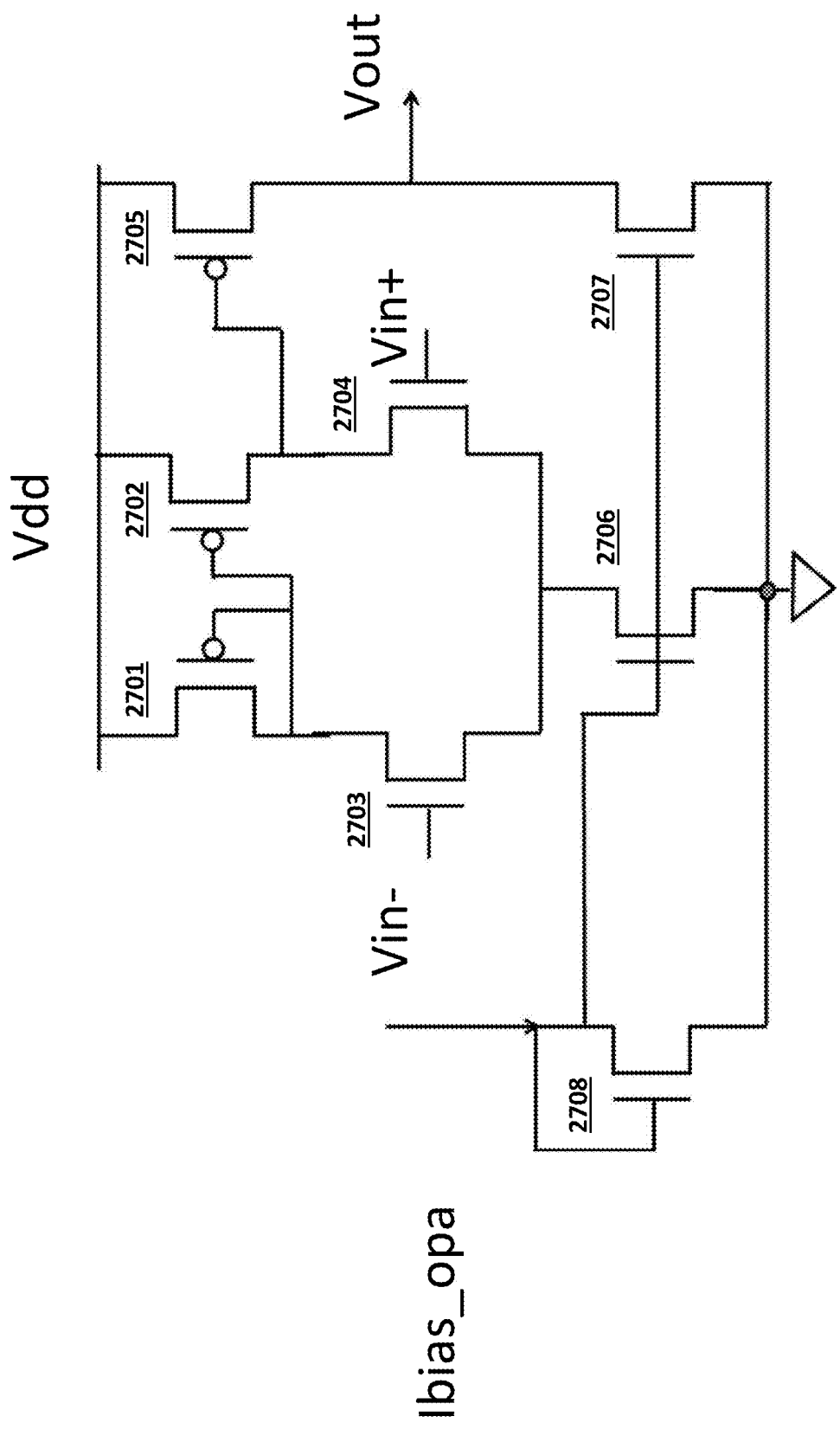
FIG. 27 depicts an operational amplifier for use in the adaptable neuron of FIG. 25.

FIG. 27 depicts operational amplifier 2700 that can be used as operational amplifier 2501 in FIG. 25. Operational amplifier 2700 comprises PMOS transistors 2701, 2702, and 2705, NMOS transistors 2703, 2704, 2706, and 2707, and NMOS transistor 2708 that acts as a variable bias, in the configuration shown. The input terminals to operational amplifier 2700 are labeled Vin+ (applied to the gate of NMOS transistor 2704) and Vin− (applied to the gate of NMOS transistor 2703), and the output is Vout. The bias current Ibias_opa is provided to the drain of NMOS transistor 2708.

Figure 28:
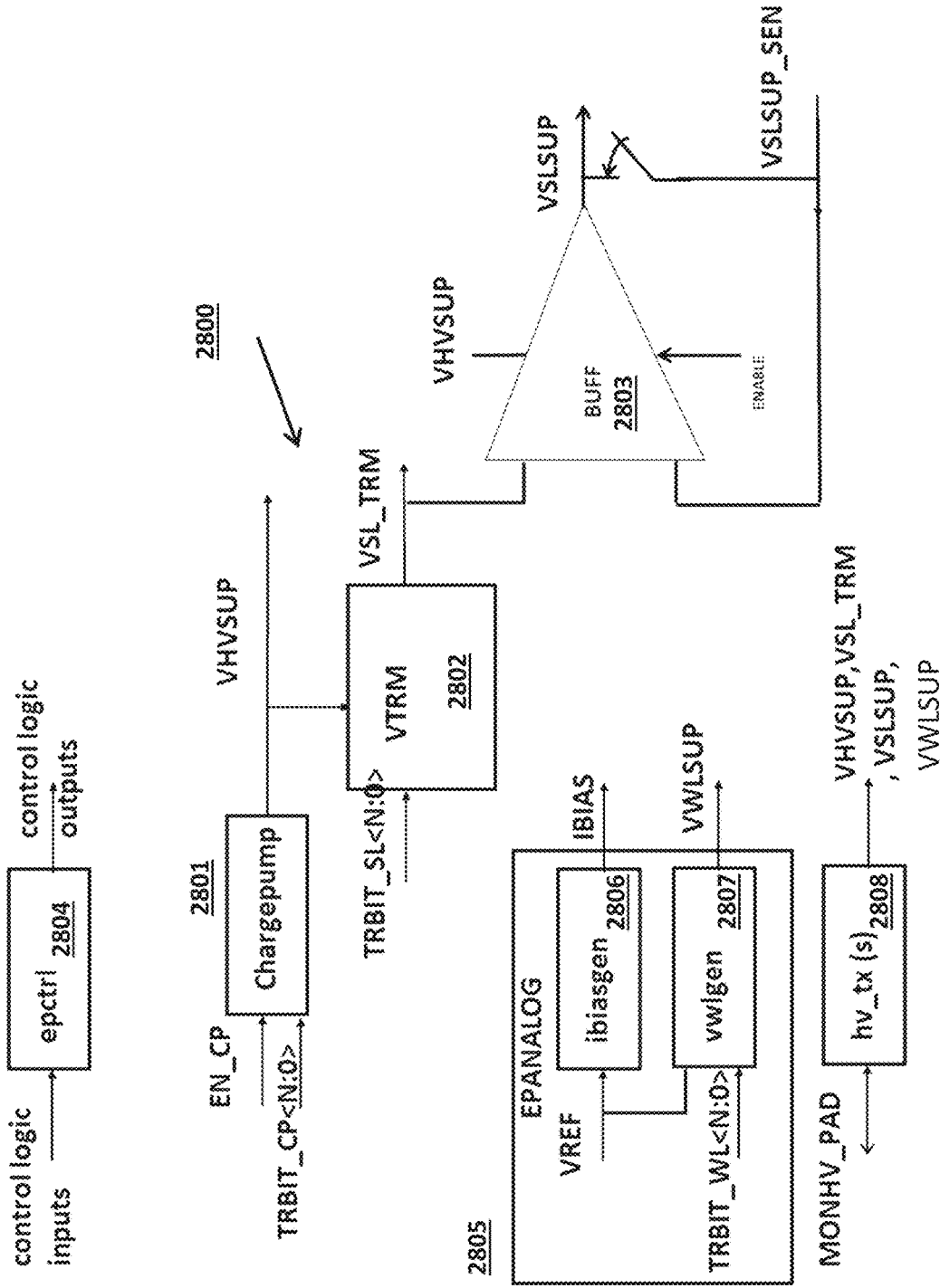
FIG. 28 depicts various blocks used in conjunction with vector-by-matrix multiplication arrays for use in the flash analog neuromorphic memory shared architecture system of FIG. 22.

FIG. 28 depicts high voltage generation block 2800 control logic block 2804, analog circuit block 2805, and test block 2808.

High voltage generation block 2800 comprises charge pump 2801, charge pump regulator 2802, and high voltage operational amplifier 2803. The voltage of the output of charge pump regulator 2802 can be controlled using the control bits TRBIT_SL<N:0> that are applied to gates of NMOS transistors in charge pump regulator 2802. Control logic block 2804 receives control logic inputs and generates control logic outputs. Analog circuit block 2805 comprises current bias generator 2806 for receiving a reference voltage, VREF, and generating a current that can be used to generate a bias signal, IBIAS, which can be used, for example, as IBIAS_OPA 2504 in FIG. 25. Analog circuit block 2805 also comprises voltage generator 2807 for receiving reference voltage VREF and a set of trim bits, TRBIT_WL, and generating a voltage to apply to word lines during various operations. Test block 2808 receives signals on a test pad, MONHV_PAD, and outputs various signals for a designer to monitor during testing.

Figure 29:
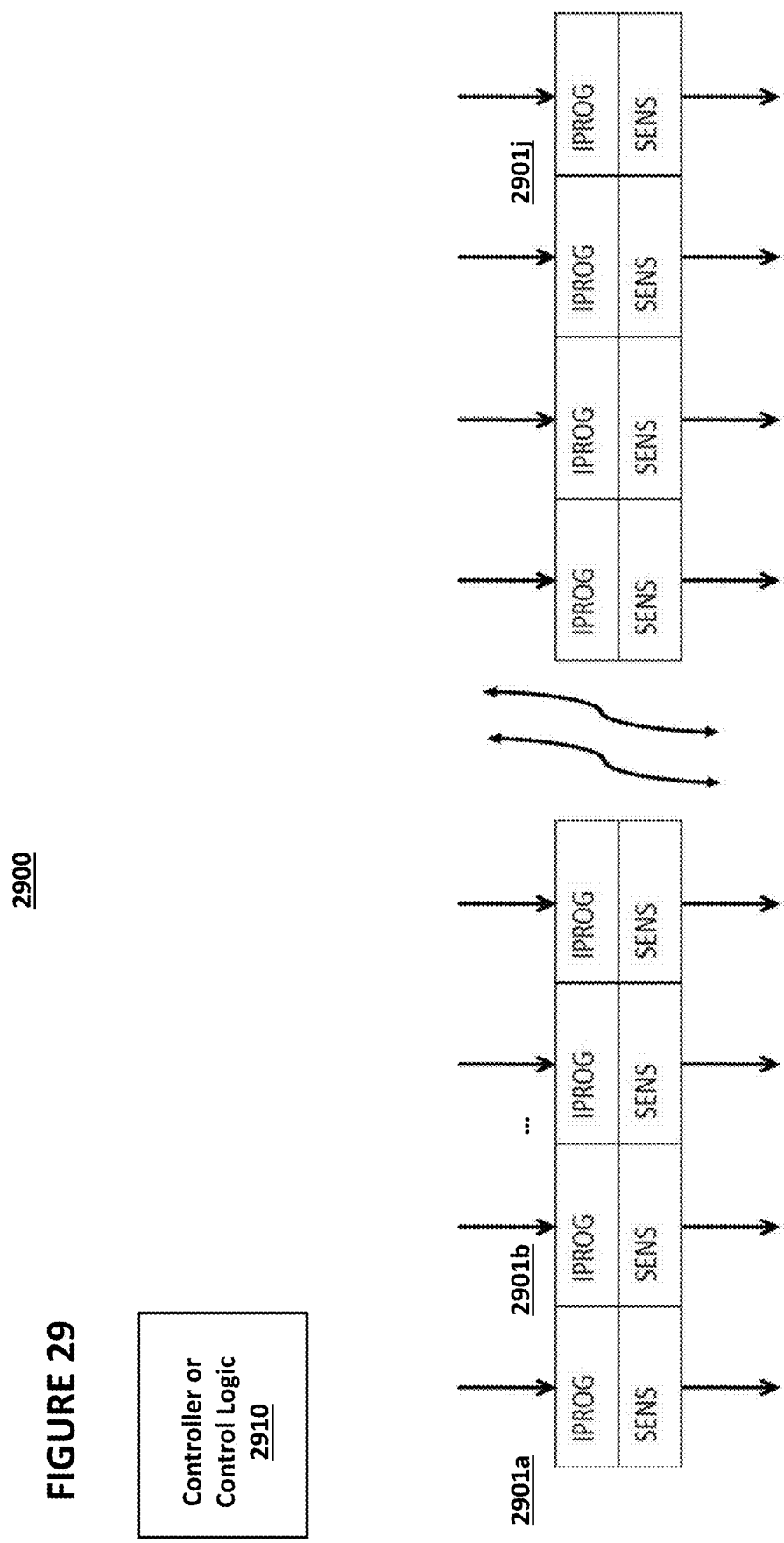
FIG. 29 depicts a program and sensing block for use in the flash analog neuromorphic memory shared architecture system of FIG. 22.

FIG. 29 depicts program and sensing block 2900, which can be used during program and verify operations and can be coupled to one or more VMM systems. Program and sensing block 2900 comprises a plurality of individual program and sense circuit blocks 2901a, 2901b, . . . 2901j, each of which can read a "0" or "1" in a selected memory cell. Controller or control logic 910 can activate the appropriate program and sense circuit blocks 2901a, 2901b, . . . 2901j during each cycle as needed.

Figure 30:
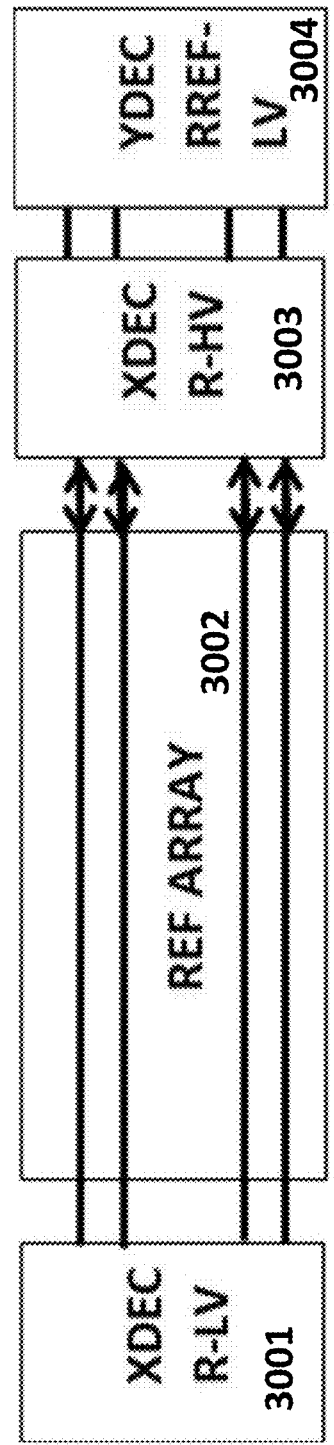
FIG. 30 depicts a reference array system for use in the flash analog neuromorphic memory shared architecture system of FIG. 22.

FIG. 30 depicts reference system 3000, which can be used in place of reference sector 2308 in FIG. 23. Reference system 3000 comprises reference array 3002, low voltage row decoder 3001, high voltage row decoder 3003, and low voltage reference column decoder 3004. Low voltage row decoder 3001 provides a bias voltage for read and program operations and provides a decoding signal for high voltage row decoder 3003. High voltage row decoder 3003 provides a high voltage bias signal for program and erase operations.

Figure 31:
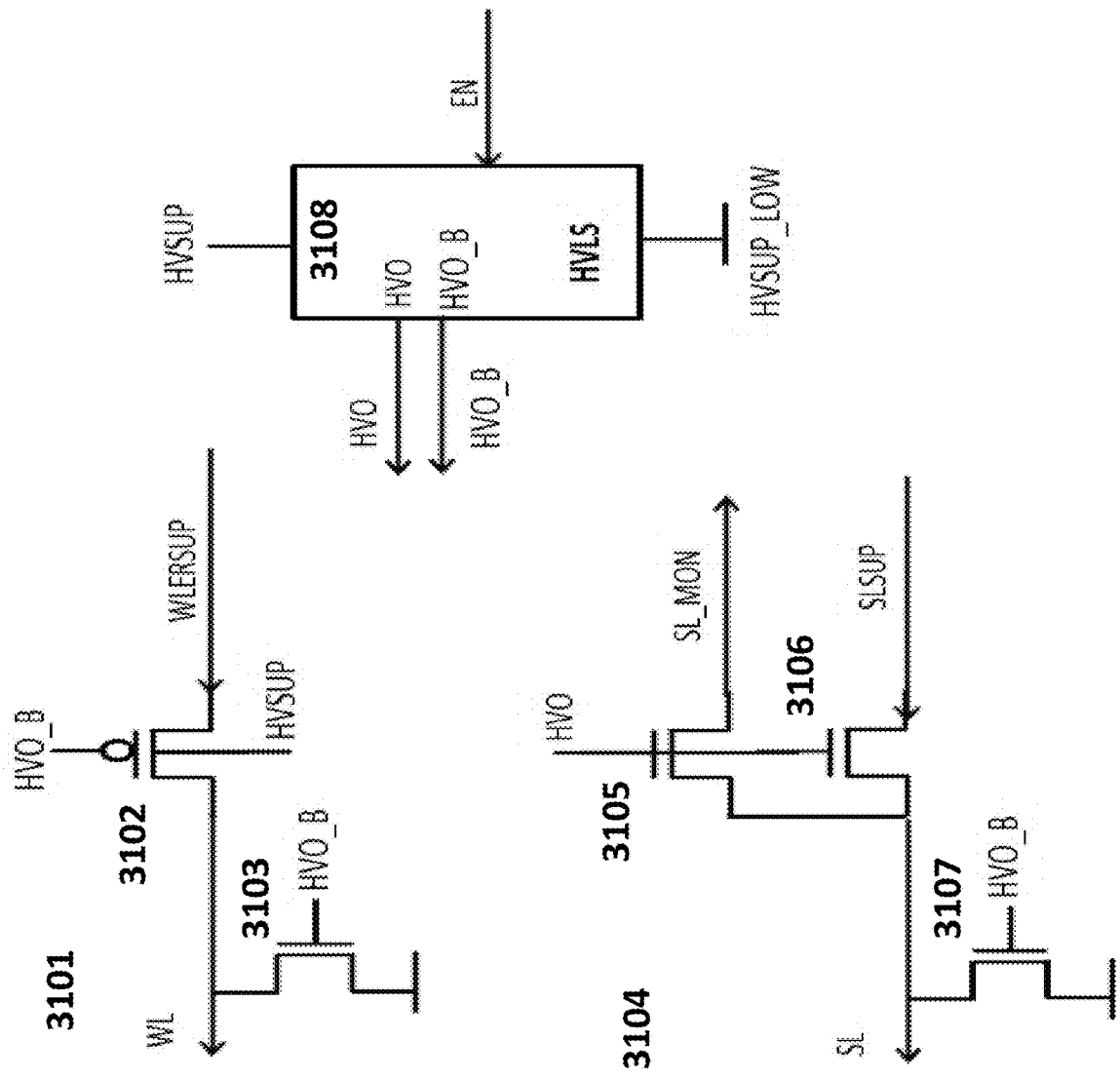
FIG. 31 depicts decoding circuitry for use in the flash analog neuromorphic memory shared architecture system of FIG. 22.

FIG. 31 depicts VMM high voltage decode circuits, comprising word line decoder circuit 3101, source line decoder circuit 3104, and high voltage level shifter 3108, which are appropriate for use with memory cells of the type shown in FIG. 2.

Word line decoder circuit 3101 comprises PMOS select transistor 3102 (controlled by signal HVO_B) and NMOS de-select transistor 3103 (controlled by signal HVO_B) configured as shown.

Source line decoder circuit 3104 comprises NMOS monitor transistors 3105 (controlled by signal HVO), driving transistor 3106 (controlled by signal HVO), and de-select transistor 3107 (controlled by signal HVO_B), configured as shown.

High voltage level shifter 3108 received enable signal EN and outputs high voltage signal HV and its complement HVO_B.

Figure 32:
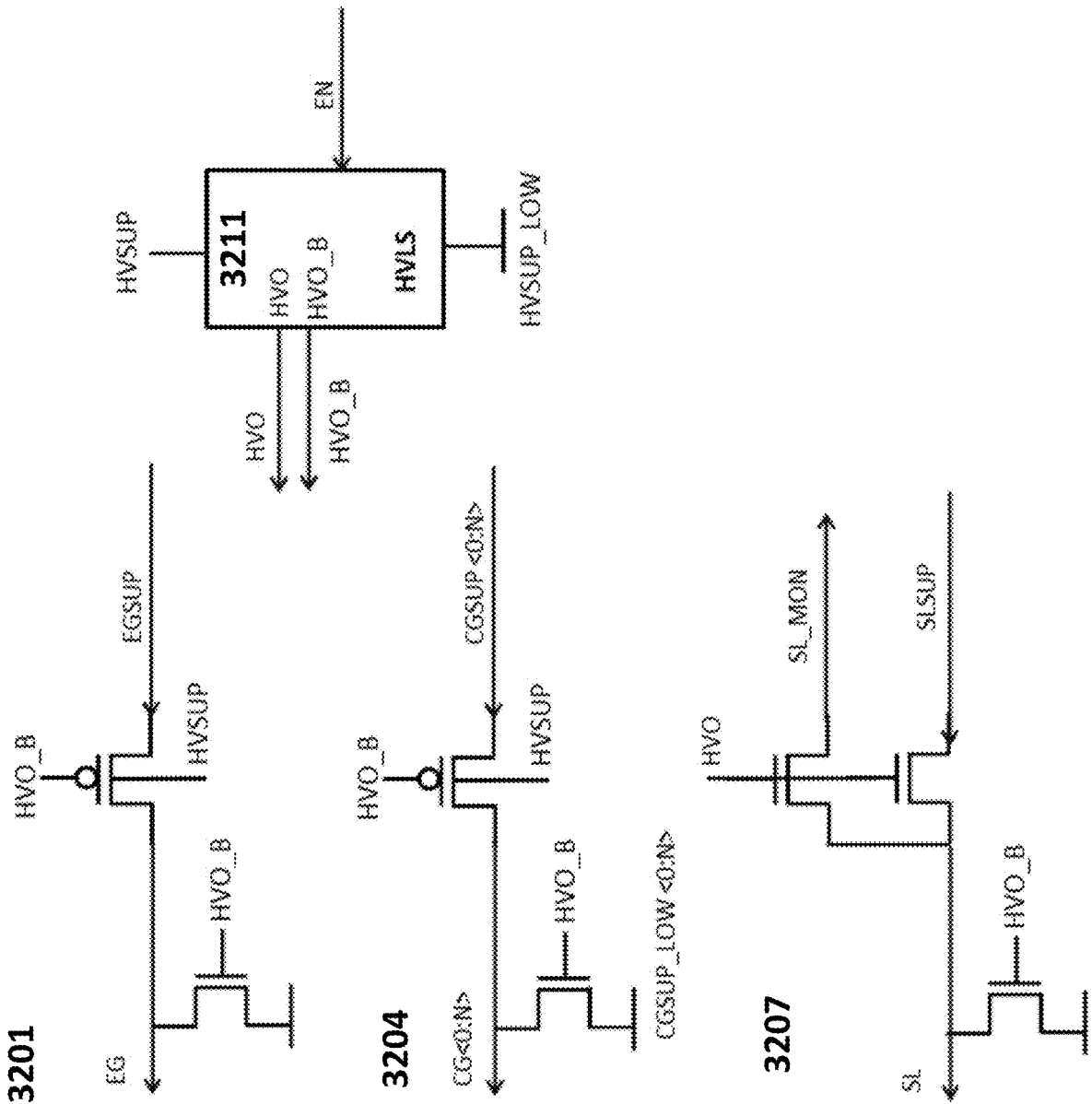
FIG. 32 depicts decoding circuitry for use in the flash analog neuromorphic memory shared architecture system of FIG. 22.

FIG. 32 depicts VMM high voltage decode circuits, comprising erase gate decoder circuit 3201, control gate decoder circuit 3204, source line decoder circuit 3207, and high voltage level shifter 3211, which are appropriate for use with memory cells of the type shown in FIG. 3.

Erase gate decoder circuit 3201 and control gate decoder circuit 3204 use the same design as word line decoder circuit 3101 in FIG. 31.

Source line decoder circuit 3207 uses the same design as source line decoder circuit 3104 in FIG. 31.

High voltage level shifter 3211 uses the same design as high voltage level shifter 3108 in FIG. 31.

Figure 33:
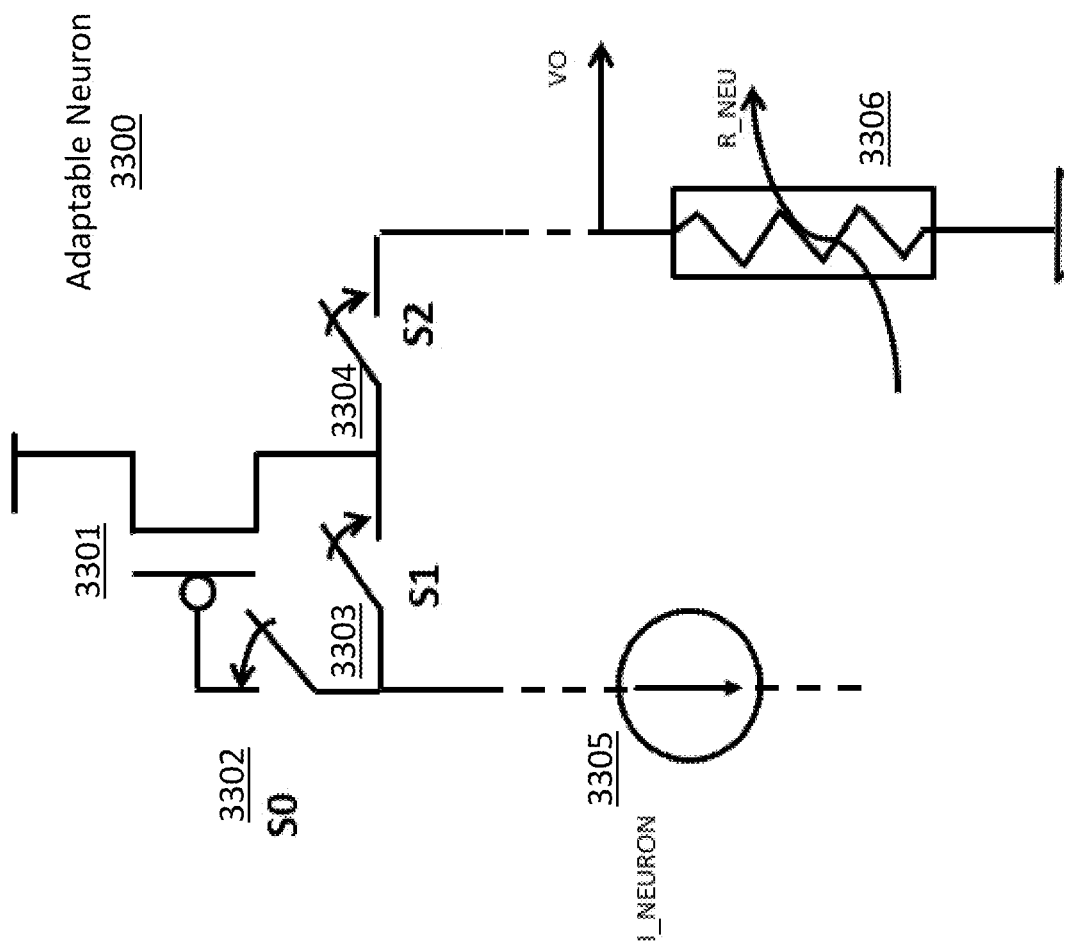
FIG. 33 depicts another adaptable neuron for use in the flash analog neuromorphic memory shared architecture system of FIG. 22.

FIG. 33 depicts adaptable neuron circuit 3300 that converts an output neuron current into a voltage. Adaptable neuron circuit 3300 uses only one PMOS transistor 3301 and essentially is configured to mirror itself (i.e., a sample and hold mirror) using switches 3302, 3303, and 3304. Initially, switch 3302 and switch 3303 are closed and switch 3304 is open, at which time PMOS transistor 3301 is coupled to I_NEURON, which is a current source 3305 that represents the current from a VMM. Then, switch 3302 and 3303 are opened and switch 3304 is closed, which causes PMOS transistor 3301 to send current I_NEURON from its drain to variable resistor 3306. Thus, adaptable neuron 3300 converts a current signal (I_NEURON) into a voltage signal (VO). Basically, transistor 3301 samples the current I_NEURON and holds it by storing a sampled gate-source voltage on its gate. An op amp circuit can be used to buffer the output voltage VO to drive the configurable interconnect.

Figure 34:
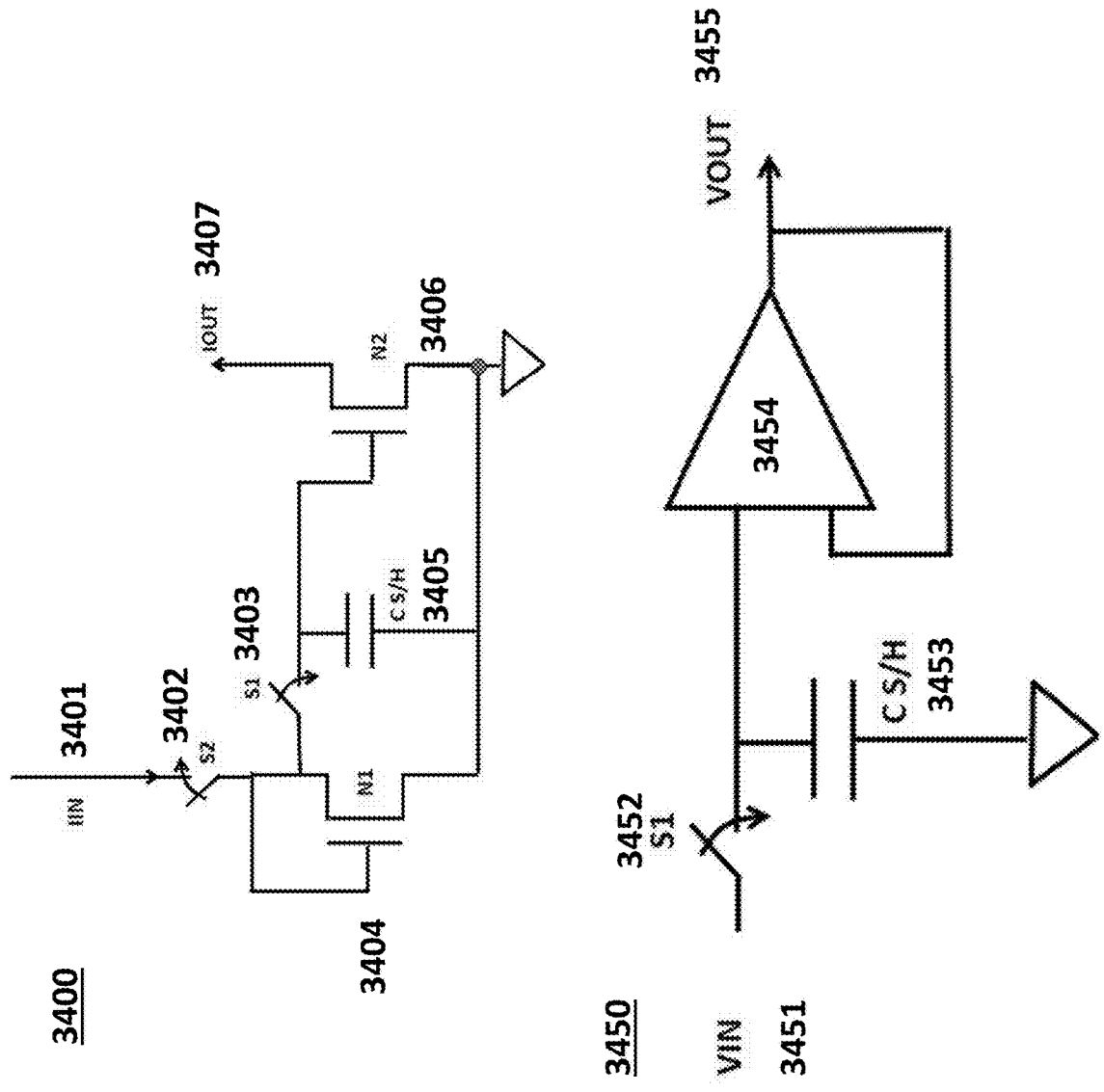
FIG. 34 depicts sample and hold circuits.

FIG. 34 depicts current sample and hold S/H circuit 3400 and voltage sample and hold S/H circuit 3450. Current S/H circuit 3400 includes sampling switches 3402 and 3403, S/H capacitor 3405, input transistor 3404 and output transistor 3406. Input transistor 3404 is used to convert input current 3401 into an S/H voltage on the S/H capacitor 3405 and is coupled to the gate of the output transistor 3406. Voltage S/H circuit 3450 includes sampling switch 3452, S/H capacitor 3453, and op amp 3454. Op amp 3454 is used to buffer the S/H voltage on the capacitor 3453. S/H circuits 3400 and 3450 can be used with the output summer circuits and/or activation circuits described herein. In an alternative embodiment, digital sample and hold circuits can be used instead of analog sample and hold circuits 3400 and 3450.

Figure 35:
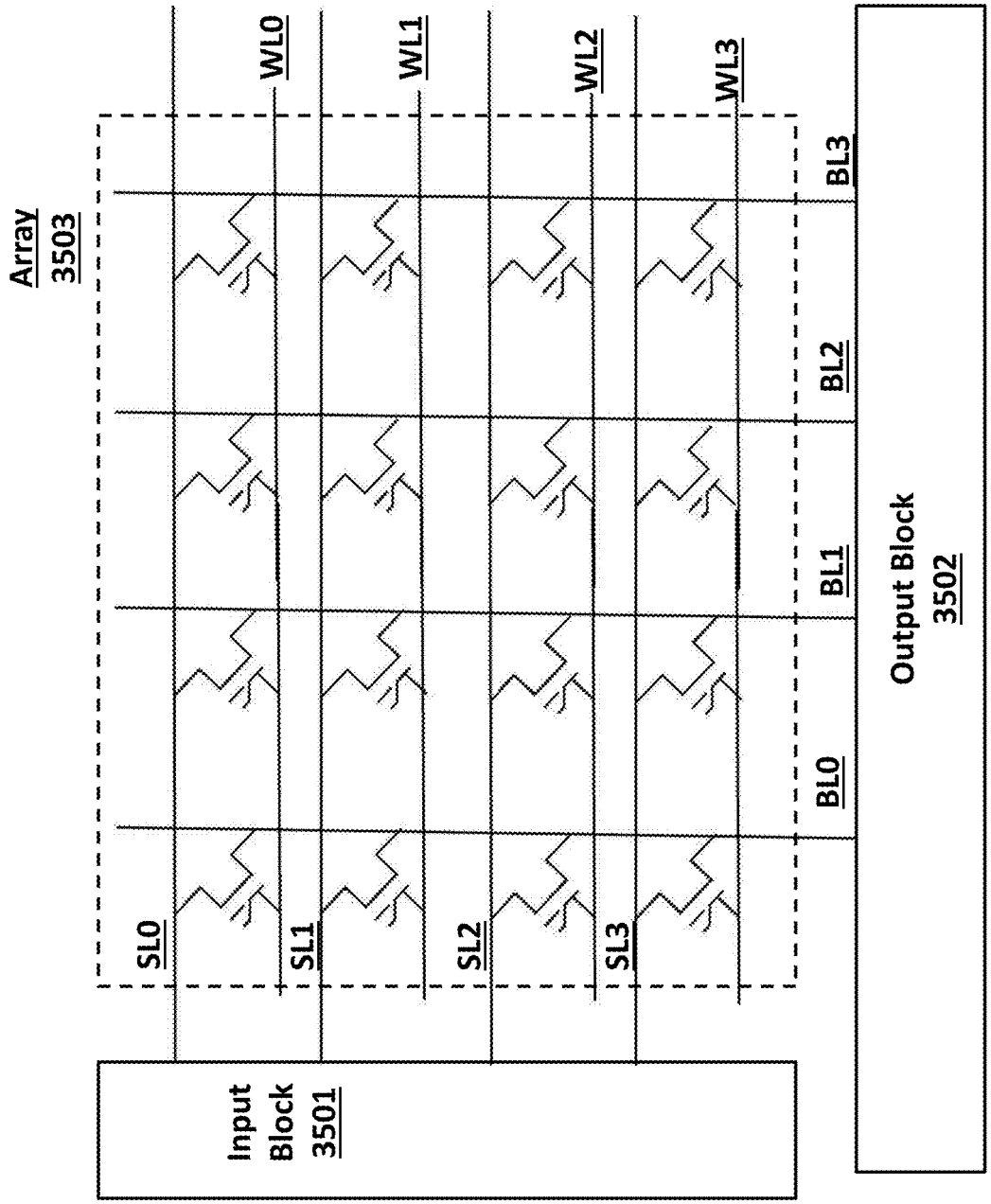
FIG. 35 depicts an array architecture that is suitable for memory cells operating in the linear region.

FIG. 35 shows an array architecture that is suitable for memory cells operating in linear region. System 3500 comprises input block 3501, output block 3502, and array 3503 of memory cells. Input block 3501 is coupled to the drains (source lines) of the memory cells in array 3503, and output block 3502 is coupled to the bit lines of the memory cells in array 3503. Alternatively, input block 3501 is coupled to the wordlines of the memory cells in array 3503, and output block 3502 is coupled to the bit lines of the memory cells in array 3503.

In instances where system 3500 is used to implement an LSTM or GRU, output block 3502 and/or input block 3501 may include multiplier block, addition block, subtraction (output=1−input) block as needed for LSTM/GRU architecture, and optionally may include analog sample-and-hold circuits (such as circuits 3400 or 3450 in FIG. 34) or digital sample-and-hold circuits (e.g., a register or SRAM) as needed.

Figure 36:
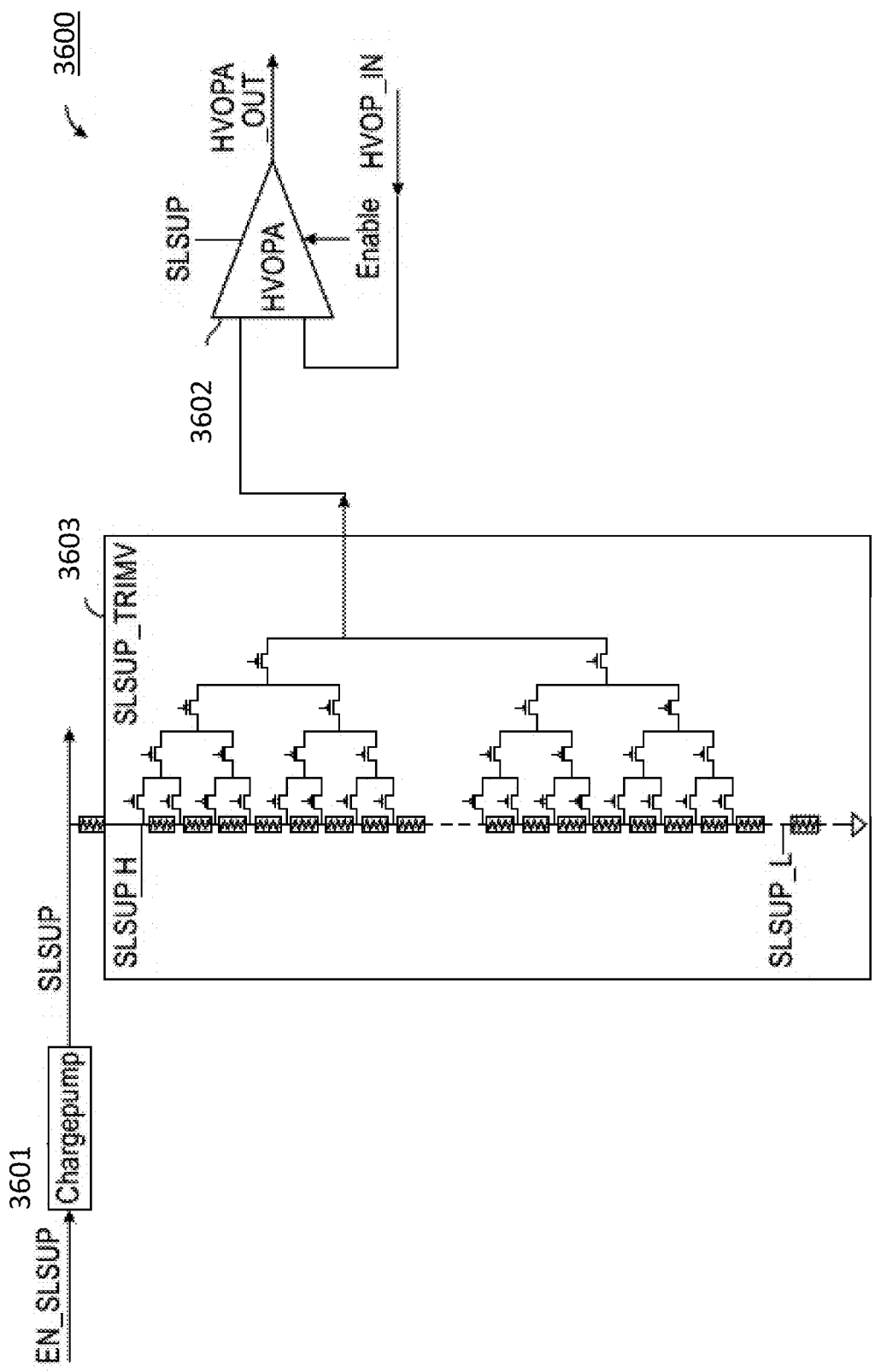
FIG. 36 depicts a high voltage generation block for use in the flash analog neuromorphic memory shared architecture system of FIG. 22.

FIG. 36 depicts high voltage generation block 3600, which is an example of high voltage generation block 2211 in FIG. 22. High voltage generation block 3600 comprises charge pump 3601, charge pump regulator 3603, and high voltage operational amplifier 3602. The voltage of the output of charge pump regulator 3603 can be controlled based on the signals sent to the gates of the mux MOS transistors in charge pump regulator 3603.

Figure 37:
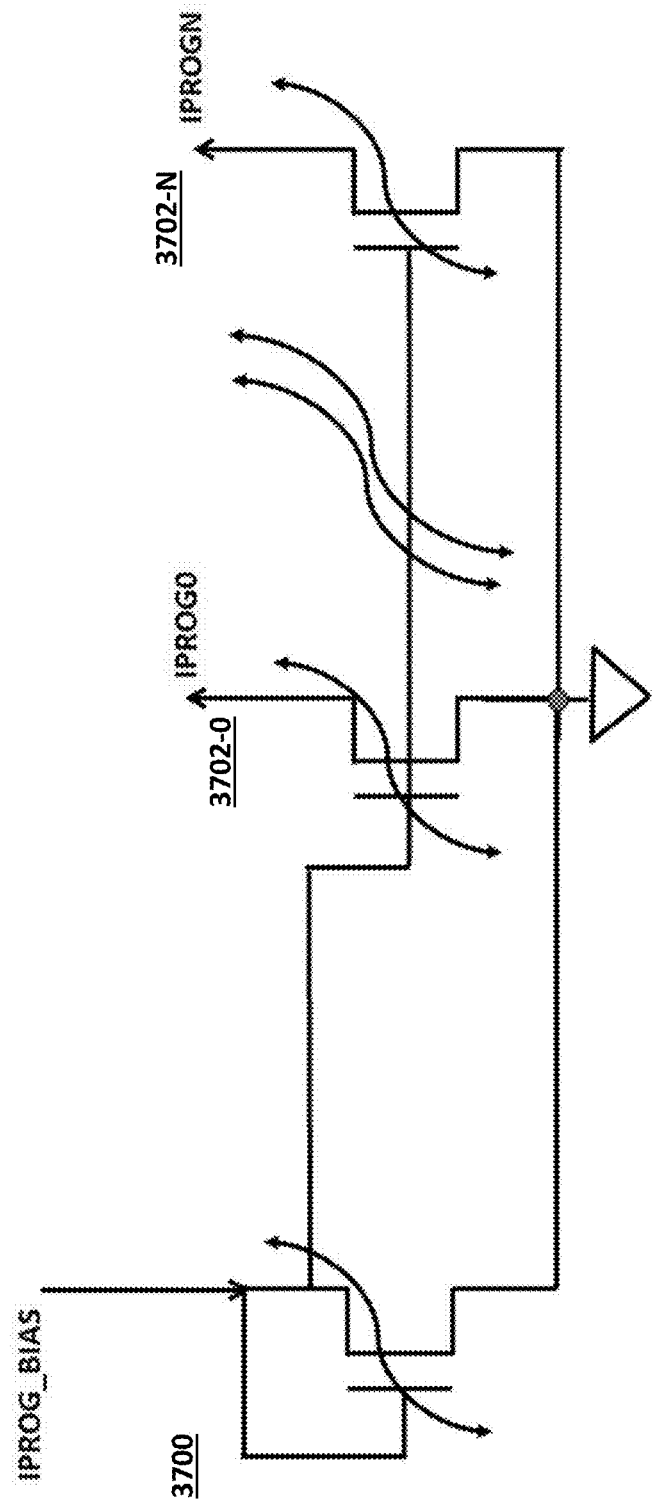
FIG. 37 depicts a program bias block for use in the flash analog neuromorphic memory shared architecture system of FIG. 22.

FIG. 37 depicts a program bias circuit 3700 that provides a bias to the gates of individual programming circuits 3702-0, . . . 3702-N that each provides a programming current to memory cells coupled to the selected bit lines during a programming operations.

FIG. 38 depicts sense amplifier 3800, which can be used for the verify aspect of program and verify operations. Sense amplifier 3800 comprises adjustable current reference source 3801, switch 3802, NMOS transistor 3803, capacitor 3804, switch 3805, current source 3806, and inverter 3807, in the configuration shown. Sense amplifier 3800 is coupled to memory cell 3808 during a verify operation of memory cell 3808.

It should be noted that, as used herein, the terms "over" and "on" both inclusively include "directly on" (no intermediate materials, elements or space disposed therebetween) and "indirectly on" (intermediate materials, elements or space disposed therebetween). Likewise, the term "adjacent" includes "directly adjacent" (no intermediate materials, elements or space disposed therebetween) and "indirectly adjacent" (intermediate materials, elements or space disposed there between), "mounted to" includes "directly mounted to" (no intermediate materials, elements or space disposed there between) and "indirectly mounted to" (intermediate materials, elements or spaced disposed there between), and "electrically coupled" includes "directly electrically coupled to" (no intermediate materials or elements there between that electrically connect the elements together) and "indirectly electrically coupled to" (intermediate materials or elements there between that electrically connect the elements together). For example, forming an element "over a substrate" can include forming the element directly on the substrate with no intermediate materials/elements therebetween, as well as forming the element indirectly on the substrate with one or more intermediate materials/elements there between.

What is claimed is:

1. An analog neuromorphic memory system, comprising:
   a plurality of vector-by-matrix multiplication systems, each vector-by-matrix multiplication system comprising:
   an array of memory cells;
   a low voltage row decoder;
   a high voltage row decoder; and
   a low voltage column decoder,
   a plurality of output blocks, each output block providing an output in response to at least one of the plurality of vector-by-matrix multiplication systems; and
   a shared verify block configured to perform a verify operation after a program operation concurrently on two or more of the plurality of vector-by-matrix systems.

2. The system of claim 1, further comprising a sensing block for sensing '0' values in memory cells, wherein the sensing block can be coupled to one or more of the plurality of vector-by-matrix multiplication systems.

3. The system of claim 1, further comprising a sensing block for sensing '1' values in memory cells, wherein the sensing block can be coupled to one or more of the plurality of vector-by-matrix multiplication systems.

4. The system of claim 1, further comprising:
   a shared sensing block configured to concurrently perform a read operation of memory cells in two or more of the plurality of vector-by-matrix systems.

5. The system of claim 1, further comprising:
   a shared trim block configured to adjust one or more components in any of the plurality of vector-by-matrix systems.

6. The system of claim 5, wherein the one or more components comprise an adjustable resistor.

7. The system of claim 5, wherein the one or more components comprise an adjustable transistor.

8. The system of claim 5, wherein the one or more components comprise an adjustable current source.

9. The system of claim 1, wherein the shared verify block is able to concurrently perform a read operation on memory cells in all of the vector-by-matrix multiplication systems.

10. The system of claim 1, wherein the memory cells are split-gate flash memory cells.

11. The system of claim 1, wherein each vector-by-matrix multiplication system is a cell in a long short term memory system.

12. The system of claim 1, wherein each vector-by-matrix multiplication system is a cell in a gated recurrent unit memory system.

13. The system of claim 1, wherein each of the plurality of output blocks comprises a summer and activation block.

14. The system of claim 13, wherein each summer and activation block is configured to perform a summing and activation function for at least one of the plurality of vector-by-matrix multiplication systems.

* * * * *